(12) United States Patent
Williams

(10) Patent No.: US 8,255,434 B2
(45) Date of Patent: Aug. 28, 2012

(54) METHOD AND APPARATUS FOR STORING DATA WITH REDUCED REDUNDANCY USING DATA CLUSTERS

(76) Inventor: Ross Neil Williams, Adelaide (AU)

( * ) Notice: Subject to any disclaimer, the term of this patent is extended or adjusted under 35 U.S.C. 154(b) by 119 days.

(21) Appl. No.: 12/876,396

(22) Filed: Sep. 7, 2010

(65) Prior Publication Data

US 2011/0004639 A1    Jan. 6, 2011

Related U.S. Application Data

(63) Continuation of application No. 11/373,420, filed on Mar. 10, 2006, now Pat. No. 7,814,129.

(60) Provisional application No. 60/661,273, filed on Mar. 11, 2005.

(51) Int. Cl.
*G06F 7/00* (2006.01)
*G06F 17/30* (2006.01)

(52) U.S. Cl. ........................... 707/812; 711/216
(58) Field of Classification Search ............ None
See application file for complete search history.

(56) References Cited

U.S. PATENT DOCUMENTS

| | | | |
|---|---|---|---|
| 4,541,076 A | | 9/1985 | Bowers et al. |
| 4,876,541 A | | 10/1989 | Storer |
| 5,049,881 A | | 9/1991 | Gibson et al. |
| 5,678,046 A | * | 10/1997 | Cahill et al. ............ 707/829 |
| 5,990,810 A | * | 11/1999 | Williams ............ 341/51 |
| 6,061,678 A | * | 5/2000 | Klein et al. ............ 1/1 |
| 6,182,151 B1 | * | 1/2001 | Cheng et al. ............ 719/310 |
| 6,615,219 B1 | * | 9/2003 | Bruso et al. ............ 707/699 |
| 2001/0049693 A1 | * | 12/2001 | Pratt ............ 707/200 |
| 2004/0139097 A1 | * | 7/2004 | Farber et al. ............ 707/100 |
| 2005/0180647 A1 | * | 8/2005 | Curry et al. ............ 382/243 |

OTHER PUBLICATIONS

Detecting duplicate among symbolically compressed images in large document database Lee et al, Pattern recognition letters vol. 22, pp. 545-550, 2001.*
Managing database with binary large objects, Shapiro et al, IEEE pp. 185-193, 1999.*
Collection-based persistent digital archives—Part 1, Moore et al, D-Lib Magazine, Mar. 200.*
Ross Williams, "An Algorithm for Matching Text (possibly original)". Google Groups, Comp. Compression, posted Jan. 27, 1992 (5 pgs).
Richard M. Karp, et al., "Efficient Randomized Pattern-Matching Algorithms". IBM J. Res. Development, Mar. 1987, pp. 249-260, vol. 31, No. 2.

\* cited by examiner

*Primary Examiner* — Pierre Vital
*Assistant Examiner* — Augustine K Obisesan

(57) ABSTRACT

Method and apparatus for storing data in a reduced redundancy form. Binary Large Objects (BLOBs) are partitioned into subblocks according to a partitioning method, and the subblocks are stored in subblock clusters. Each BLOB is represented as a list of spans of subblocks which identifies a contiguous sequence of subblocks within a cluster. Storage redundancy can be reduced because the spans of two different BLOBs can refer to the same subblocks. An index may be used to map subblock hashes to subblock cluster numbers.

2 Claims, 18 Drawing Sheets

Conventional Storage System

Conventional Storage System with Compression

METHOD AND APPARATUS FOR STORING DATA WITH REDUCED REDUNDANCY USING DATA CLUSTERS

CROSS-REFERENCE

CROSS-REFERENCE TO RELATED APPLICATIONS

This is a continuation of U.S. patent application Ser. No. 11/373,420 entitled "METHOD AND APPARATUS FOR STORING DATA WITH REDUCED REDUNDANCY USING DATA CLUSTERS," filed Mar. 10, 2006, by Ross Neil WILLIAMS; which claims benefit of U.S. Provisional Patent Application No. 60/661,273 filed Mar. 11, 2005, by Ross Neil WILLIAMS.

This application is related to the following copending patent applications: application Ser. No. 11/372,603, for Method and Apparatus for Indexing in a Reduced-Redundancy Storage System, invented by Ross Neil Williams; and application Ser. No. 13/177,799, for Method and Apparatus for Detecting the Presence of Subblocks in a Reduced-Redundancy Storage System, invented by Ross Neil Williams which are incorporated herein by reference in their entirety.

FIELD

The field of the invention relates to a method and apparatus for storing data in computer systems in a form that uses less storage space.

BACKGROUND OF THE INVENTION

Conventional computer storage systems typically store sequences of bytes as named files in file systems. Despite the fact that many files may be very similar to each other, and have large portions of data in common 130, 132 (FIG. 13), these systems may not eliminate this redundancy. Instead, they may store each file separately 140, 142 keeping a number of copies 130, 132 of the same data (FIG. 14).

Some conventional file systems incorporate conventional non-lossy text compression algorithms (such as GZip) to compress individual files, but this can be viewed as a "keyhole" redundancy elimination technique because it analyses the redundancy of a single file at a time rather than the file system as a whole. These conventional text compression algorithms may be incapable of spotting similarities between widely separated data 150, 152 such as two similar files 130, 132 in different parts of a file system (FIG. 15).

What is desired is a method and apparatus for representing data in a form that makes it possible to identify some of their repeated sequences of data and to reduce the number of copies of this repeated data that is stored.

SUMMARY OF THE INVENTION

In order to represent several different Binary Large Objects (BLOBs) 10, 12 in a way that causes the number of copies of their repeated sequences of data to be reduced, a representation may be used that allows each repeated sequence to be referred to by more than one BLOB's representation. FIG. 16 depicts one way in which this might be achieved. In this embodiment, each BLOB 160, 162 is divided up into pieces called subblocks A, B, C, D, E, F, G and duplicate subblocks 164, 166 are identified and stored just once. Within this framework, the following issues are addressed: the manner in which the BLOBs should be subdivided, the way in way in which the resulting subblocks should be stored, and the method for identifying duplicate subblocks.

In an aspect of the invention, each BLOB 10, 12 of data to be stored is divided into subblocks A-J using a partitioning method (FIG. 1). A variety of partitioning method can be used, but in particular, a fixed-length partitioning method could be used that divides the data into fixed-length subblocks 60-65 (FIG. 6), or a variable-length partitioning method could be used (FIG. 10) that divides the data into variable-length subblocks E, F, G, A, B, C, D at positions determined by the data itself (FIG. 1). An example of this latter method is disclosed in U.S. Pat. No. 5,990,810 to Williams, the same inventor as this invention, which is incorporated into this specification by reference and depicted pictorially in FIG. 37.

The subblocks become the unit of redundancy elimination and, in some embodiments, the system stores each unique subblock at most once. In other embodiments, the number of copies of each unique .subblock is reduced, but may be greater than one.

In an exemplary embodiment, the subblocks of BLOBs are stored in groups called subblock clusters 20, 22, 24 (FIG. 2). Each BLOB can be represented by an ordered list (or tree) of records ("span records") 30, 31, 32, each of which identifies a contiguous sequence of subblocks within a single cluster 20, 22, 24 (FIG. 3 and FIG. 4). The BLOB 10 may be represented 34 as the concatenation of the sequences identified by the list of spans 30, 31, 32 (FIG. 3 and FIG. 4) and can be retrieved from the store by running down the BLOB's list of spans retrieving the subblock content in the subblocks referred to by each span.

In an exemplary embodiment, a cluster 20, 22, 24 may contain subblocks from more than one BLOB X and Y (FIG. 4), and a BLOB's subblocks may reside in more than one cluster (FIG. 3). In an exemplary embodiment, a BLOB's subblocks may be stored sequentially within one or more clusters (FIG. 2). This improves the efficiency of BLOB retrieval because an entire sequence of subblocks within a BLOB can be read from the disk in a single sequential read operation. This is far more efficient than performing a random-access disk seek for each subblock.

In an exemplary embodiment, different spans in the same or different BLOBs to include the same subblocks (FIG. 4). This allows redundancy reduction because BLOBS that contain the same subblocks may be represented by spans that point to the same subblocks (in clusters).

In a further aspect of the invention, each cluster is compressed using a data compression method so as to reduce the amount of space used by the clusters. The simplest way to do this is to compress the entire cluster. In some embodiments (particularly those that employ large clusters), it may be desirable to compress each part of the cluster (e.g. individual subblocks or runs of subblocks) separately so as to allow subblocks within the cluster to be accessed without having to decompress the entire cluster (or at least the part of the cluster before the subblock to be read).

In a further aspect of the invention, a directory 70 of the subblocks within each cluster is created for each cluster and stored either within the cluster (typically at the start) (FIG. 7) or separately 80, 82 (FIG. 8). The directory could also be distributed throughout the cluster (FIG. 9), for example by storing each subblock's metadata before the subblock. The directory can contain a variety of metadata for each subblock such as its hash, its length, a subblock identifier, and its position within the cluster.

In a further aspect of the invention, subblocks that are shared by more than one BLOB are identified. In an exemplary embodiment, a subblock index 50 is maintained that maps (or otherwise associates) subblock content or subblock hashes (the hash of a subblock's content), to clusters 52, 54, 56 (FIG. 5). During store operations, each subblock to be stored is looked up in the subblock index. If present, the subblock is not stored again. If the subblock is absent, it is stored in a cluster and an entry for it added to the subblock index. In either case, the new subblock is referenced by a span 58.

In an aspect of the invention, when the index indicates that a particular subblock is already present in the store, the matching subblock's cluster is accessed and the subblocks following the matching subblock in the cluster are compared with the subblocks following the matching subblock in the BLOB to be stored (FIG. 10). This comparison can be performed without accessing the index, and in fact can be performed without accessing the actual subblock content data, so long as the cluster containing the subblock has a subblock directory that contains subblock hashes.

Terminology

Absent Subblock: A subblock that is not present in the store.

BLOB (Binary Large OBject): This is a finite sequence of zero or more bytes (or bits) of data. Despite its name, a BLOB is not necessarily large; a BLOB could be as small as a few bits or bytes or as large as gigabytes.

BLOB Record: A record maintained in a store that records information about a particular BLOB. The BLOB record may also contain, or refer to, a list (or tree) of spans that define the BLOB content.

BLOB Table: A data structure that associates BLOB identifiers (for example, without limitation, BLOB hashes) to BLOB records.

Cluster: Short for "Subblock Cluster". A group of associated subblocks. A cluster may have an associated subblock directory that provides information about the subblocks in the cluster.

Cluster Subblock Directory: A collection of metadata that provides information about subblocks in a cluster. A subblock's metadata can include (but is not limited to) a subblock's length, hash, identifier, and reference count.

Contiguous: Two things, within an ordered group of things, are contiguous if they are adjacent. N things, within an ordered group of things, are contiguous if the N things contain exactly N–1 adjacent pairs of things (i.e. if the N things appear as a single continuous run).

Contiguous Subblocks: Two subblocks are contiguous, in some context (e.g. a BLOB or cluster), if they are adjacent. N subblocks are contiguous, in some context, if the N subblocks contain exactly N–1 pairs of subblocks that are adjacent (i.e. the subblocks appear as a single continuous run).

Directory: See Cluster Subblock Directory.

Disk: A random access storage medium used by computers. Typically the term refers to spinning platters of metal holding magnetised data (hard disks). In the context of this document, the term may more broadly be taken to mean a random access storage medium that is significantly slower than Memory.

Fixed-Length Partitioning Method: A method for partitioning data that divides the data into fixed-length subblocks. For example, a fixed-length partitioning method might divide a BLOB into 512-byte subblocks.

Hash: A fixed-length sequence of bytes (or bits) generated by a hash algorithm. Hashes of subblocks may be used as representatives of the subblocks to index and compare the subblocks.

Hash Algorithm: An algorithm that accepts a finite sequence of bytes (or bits) and generates a finite sequence of bytes (or bits) that is highly dependent on the input sequence. Typically a hash algorithm generates output of a particular fixed length. Hash algorithms can be used to test to see if two sequences of data might be identical without having to compare the sequences directly. Cryptographic hashes practically allow one to conclude that two subblocks are identical if their hashes are identical. Hash algorithms can be used in exemplary embodiments (without limitation) to generate BLOB identifiers, compare subblocks, and generate hash table keys.

Hash of Subblock: See Subblock Hash.

Index: See Subblock Index.

Index Bucket: In embodiments that implement the subblock index using a hash table, the hash table may be organised as an array of buckets each of which contains a fixed number of entry slots each of which may either be empty or contain an entry. One purpose of index buckets is to organise a hash table into pieces that can be read from disk and written to disk as a group so as to reduce the number of random access disk operations.

Index Entry: A record in the subblock index. In some embodiments an index record contains an index key and an index value. In some embodiments an index record contains part of an index key and an index value. In some embodiments an index record contains just an index value. In some embodiments an index record contains no value and some or all of a key.

Index Key: The information about a subblock provided to the subblock index in order to retrieve information about the subblock. In some embodiments, the information is retrieved by locating and reading an index entry.

Index Value: The information yielded about a subblock by the index when the subblock (or a derivative of the subblock, an example of which is its hash) is looked up in the index. In some embodiments, the value consists of the location of the subblock on disk. In other embodiments there may be no value if the sole purpose of the index is to record the presence or absence of a key. In some embodiments, the value consists simply of a cluster number.

Length of Subblock: The number of bytes (or bits) in the subblock's content.

Linear Search: A way of searching for an object within a collection of objects by inspecting the objects in the collection one by one and where the choice of the next object to inspect is not influenced by the result of earlier inspections.

List Of Spans: An ordered list of spans. Such a list can be used to represent the content of a BLOB.

Matching Run: A sequence of subblocks (in a cluster) that matches another sequence of subblocks (which may be, for example, in a BLOB being stored). In some embodiments the sequence of subblocks is contiguous.

Memory: A random access storage medium used by computers, typically referring to Random Access Memory (RAM). In the context of this document, the term may more broadly be taken to mean a random access storage medium that is significantly faster than Disk.

Partitioning Method: A method for dividing a BLOB into one or more subblocks such that every byte (or bit) in the BLOB falls within exactly one subblock.

Present Subblock: A subblock that is present within the store.

Reduced Redundancy: Refers to the reduction, in any kind of data representation, of the number of copies of identical sequences of bytes (or bits).

Reduced-Redundancy Store: A storage system that eliminates, in its representation of data, some of the duplicated data within the set of data that it stores.

Reference to a Subblock: A piece of data that identifies a subblock. For example, and without limitation, a reference may identify a subblock by content or by storage location.

Reference Counting: A method for determining when an entity is no longer required. The method involves maintaining a counter that records the number of references that exist to the entity. When the reference count drops to zero, the entity may be deleted. In some embodiments, BLOBs and/or subblocks have reference counts.

Span: A sequence of subblocks within a cluster. In some embodiments the sequence is contiguous.

Span Record: A record that identifies a span within a cluster. In some embodiments, a span record contains a cluster number field, a starting subblock identifier field and a span length (in subblocks or bytes) field.

Store: See Reduced Redundancy Store.

Subblock: A sequence of bytes (or bits) that has been identified as a unit for the purpose of indexing, comparison and/or redundancy elimination. A BLOB may be partitioned into subblocks.

Subblock Cluster: A group of one or more subblocks that are stored together. "Cluster" for short.

Subblock Content: The actual data of a subblock, as distinct from the subblock's metadata.

Subblock Directory: See Cluster Subblock Directory.

Subblock Expiry Date: A piece of metadata associated with a subblock that defines the earliest date when the subblock is guaranteed not to be required by the user.

Subblock Hash: The result of applying a hash algorithm to a subblock. Hashes of subblocks may be used, for example, as representatives of the subblocks to index and/or compare the subblocks.

Subblock Identifier: A piece of metadata associated with a subblock. An identifier is unique to the subblock within the cluster, and can therefore be used to unambiguously identify the subblock within its cluster. In some embodiments, subblocks in different clusters may have the same identifier.

Subblock Index: A data structure that maps (or otherwise associates) a subblock's hash (or the subblock itself) to the location of the subblock (e.g., without limitation, a cluster number (and possibly also a subblock identifier)).

Subblock Metadata: Information about a subblock. A subblock's metadata can include (without limitation) the subblock's length, the subblock's hash, the subblock's identifier, the subblock's expiry date, and the subblock's reference count.

Subblock Record: A record in a cluster subblock directory that contains metadata for a single subblock.

Subblock Reference Count: A piece of subblock metadata that records the current number of references to the subblock. In some, embodiments, this will be the number of span records that define a span that includes the subblock.

Subblock Serial Number: A form of subblock identifier. For example, in an embodiment that uses a serial number system, subblocks arriving in a particular cluster are allocated a serial number, starting with 1 for the first subblock and working upwards. In some embodiments, serial numbers are not re-used if subblocks are deleted. In these embodiments, serial numbers provide a way to uniquely identify a subblock within a cluster.

User: A piece of software that is storing and retrieving BLOBs in the store.

Variable-Length Partitioning Method: A partitioning method that divides BLOBs into variable-length subblocks. In a preferred embodiment, a variable-length partitioning method will divide the data at boundaries determined by the content of the data. For example, without limitation, a partitioning method might define a subblock boundary at each position in a BLOB where the previous several bytes hash to a particular predetermined constant value.

Virtual Block Device: A device consisting of an array of fixed-length storage blocks provided by an operating system. The virtual device may correspond directly to a physical device, or may be constructed from one or more physical devices (eg. using RAID).

Whole Key: A key that is used as a source for smaller derived keys. As a data structure grows and larger derived keys are required, an increasing part of the whole key may be used to form the derived key.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

The reference to any prior art in this specification is not, and should not be taken as, an acknowledgement or any form of suggestion that such prior art forms part of the common general knowledge.

INCORPORATION BY REFERENCE

All publications and patent applications mentioned in this specification are herein incorporated by reference to the same extent as if each individual publication or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION OF THE INVENTION

Specific embodiments of the invention will now be described in some further detail with reference to and as illustrated in the accompanying figures. These embodiments are illustrative, and are not meant to be restrictive of the scope of the invention. Suggestions and descriptions of other embodiments may be included within the scope of the invention but they may not be illustrated in the accompanying figures or alternatively features of the invention may be shown in the figures but not described in the specification.

Figure 1:
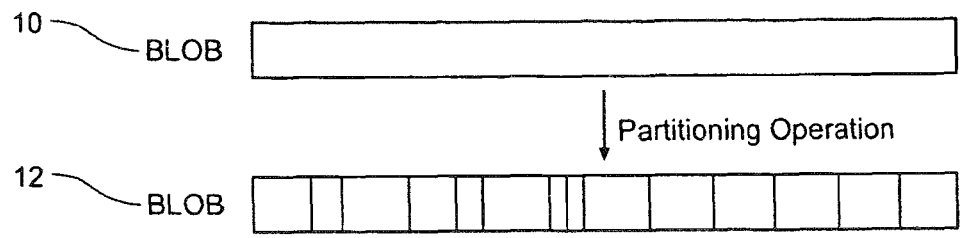
FIG. 1 depicts the partitioning of a BLOB into subblocks.
Figure 2:
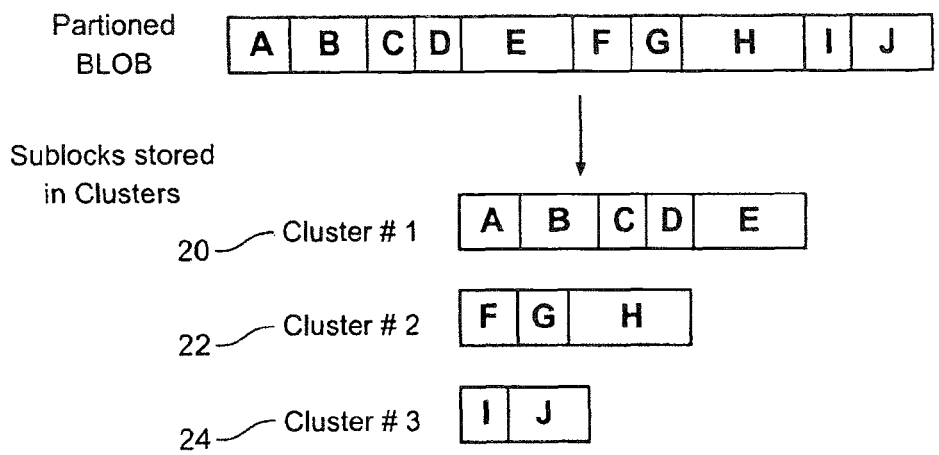
FIG. 2 depicts the storage of a BLOB's subblocks in clusters.
Figure 3:
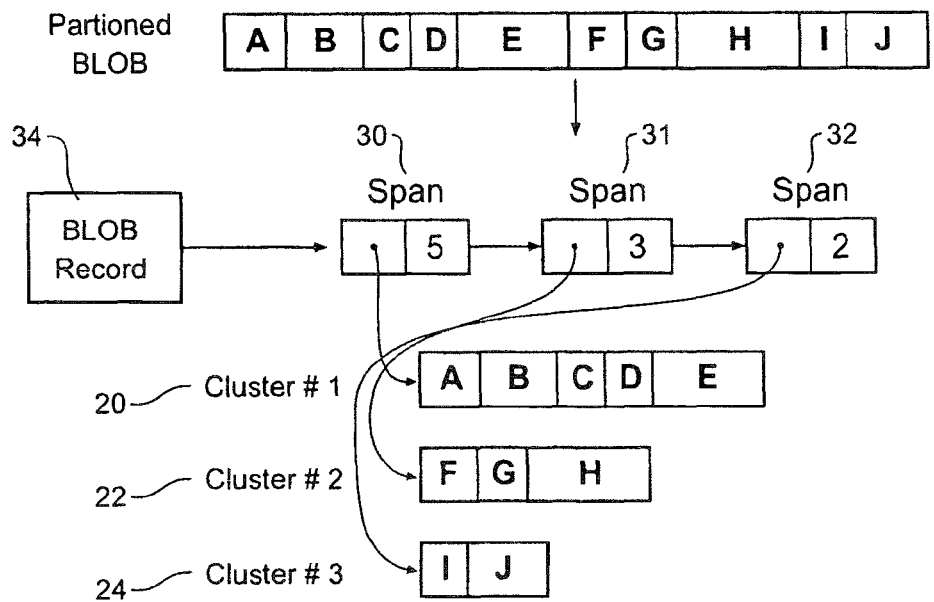
FIG. 3 shows how a BLOB can be represented as an ordered list of spans that identify runs of subblocks within clusters.
Figure 4:
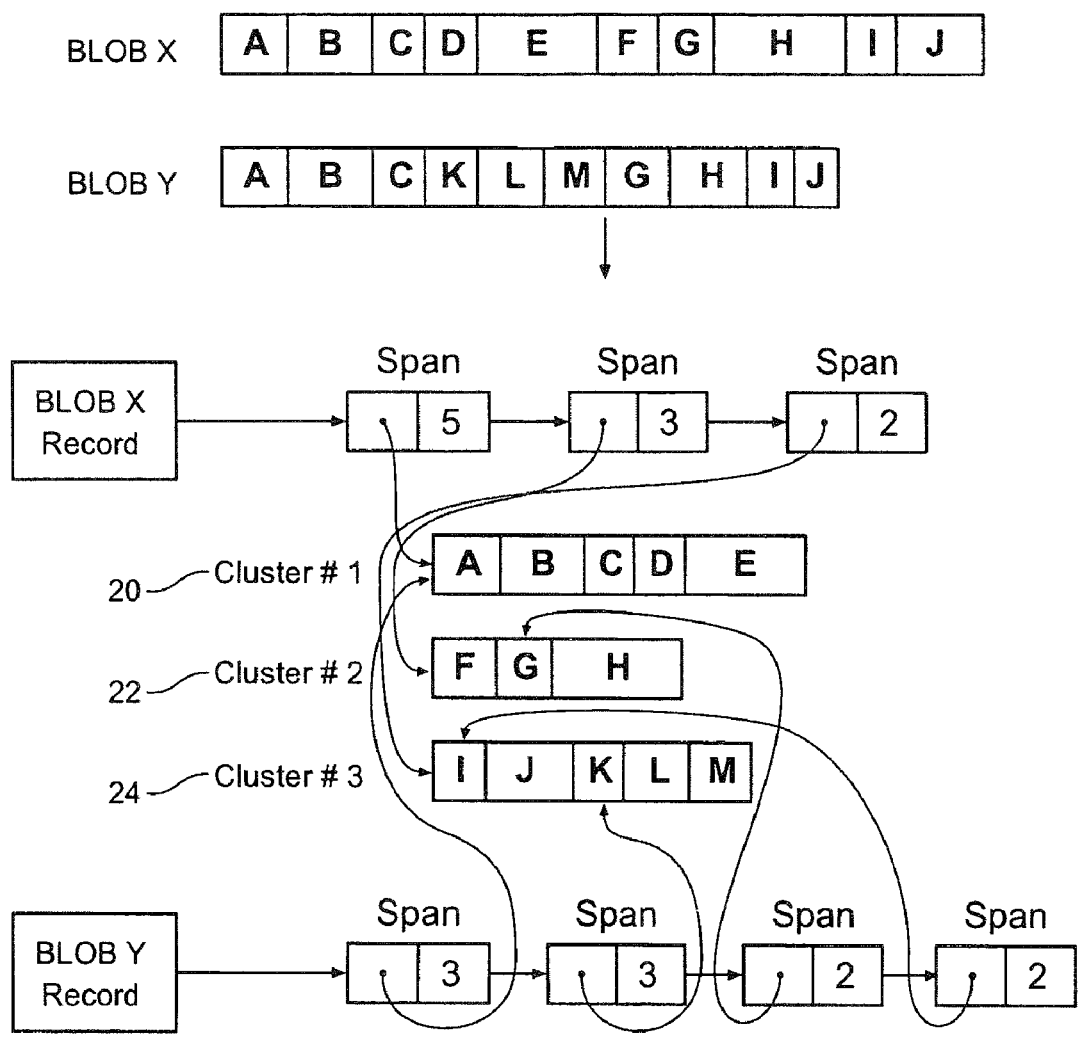
FIG. 4 shows how two different BLOBs that contain common sequences of data (subblocks A-C and G-J) can be represented in a way that does not require each repeated subblock to be stored more than once.
Figure 5:
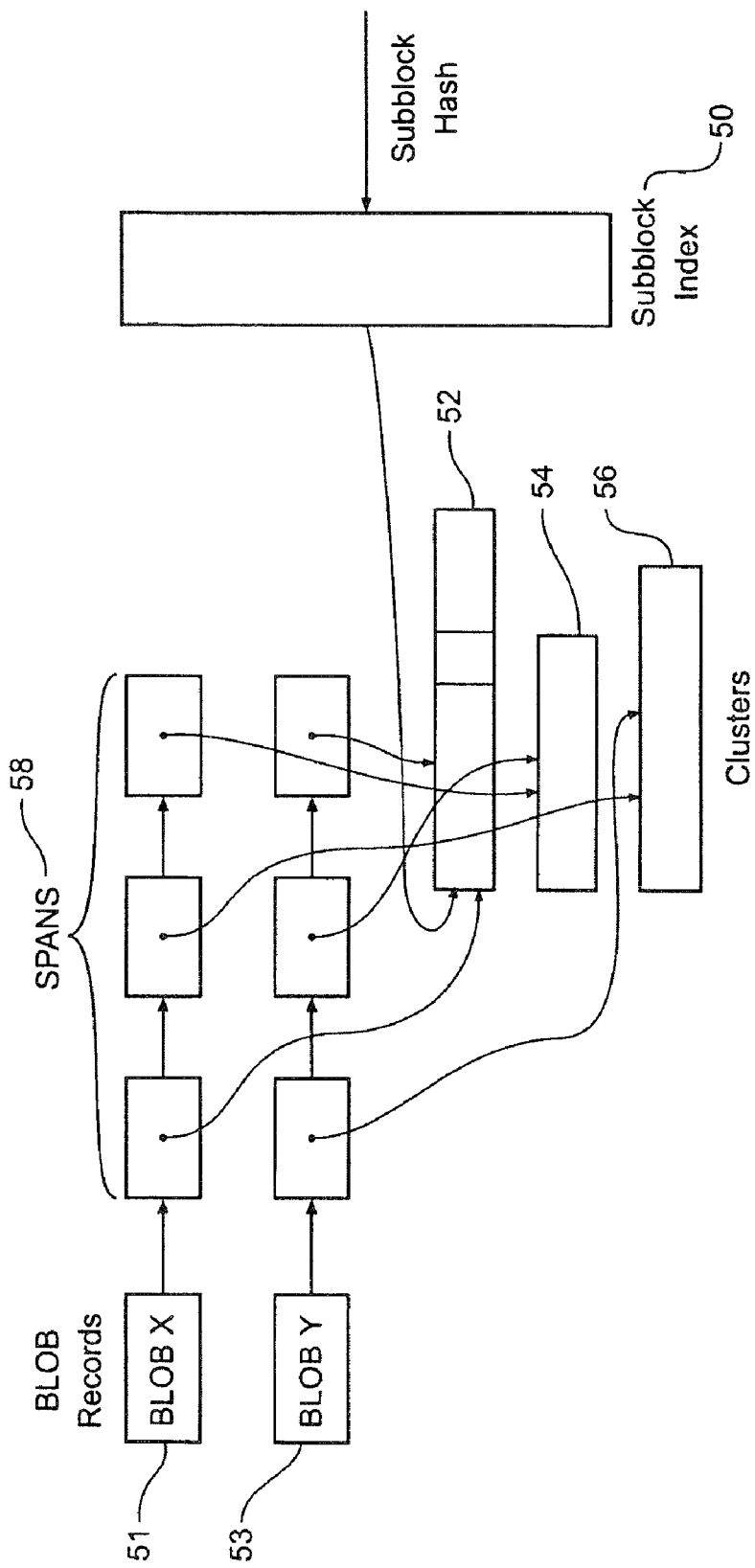
FIG. 5 depicts an index that maps each subblock's hash to the number of the cluster containing the subblock.
Figure 6:
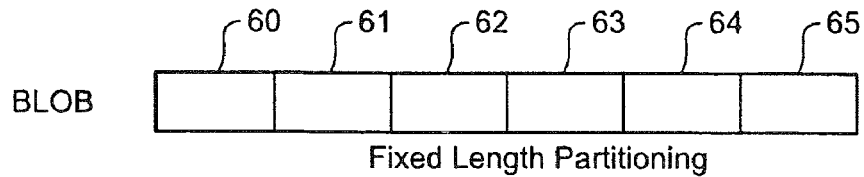
FIG. 6 depicts a partitioning method that divides a BLOB into fixed-length subblocks.
Figure 38:
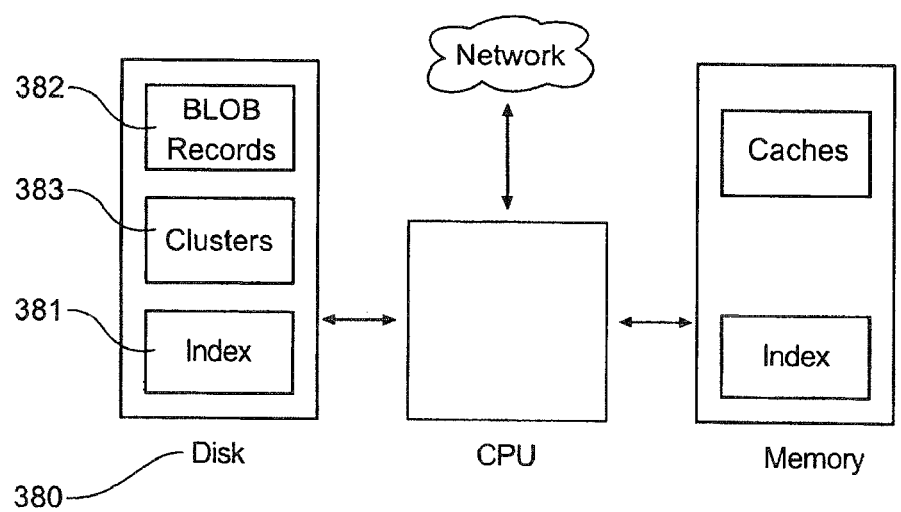
FIG. 38 shows how a reduced redundancy storage system might be deployed on typical computer hardware. All the data structures reside on disk. The index is also held in memory along with some caches that store working copies of some BLOB records and clusters.

FIG. 5 provides an overview of elements of a typical embodiment of the invention. This embodiment contains BLOB records 51, 53, span lists 58, clusters 52, 54, 56 and a subblock index 50. FIG. 38 shows how these elements might be deployed on typical computer hardware. All the data structures reside on disk 380. The index 381 is also held in memory along with some caches that store working copies of some BLOB 382 records and clusters 383.

I. An Overview Of Hash Functions

Although hash functions are not used in all embodiments, hash functions provide advantages in many embodiments. The following is an overview of exemplary hash functions that may be used in connection with various embodiments of the present invention.

A hash function accepts a variable-length input block of bits and generates an output block of bits that is based on the input block. Most hash functions guarantee that the output block will be of a particular length (e.g. 16 bits) and aspire to provide a random, but deterministic, mapping between the infinite set of input blocks and the finite set of output blocks. The property of randomness enables these outputs, called "hashes", to act as easily manipulated representatives of the input block.

Hash functions come in at least four classes of strength.

Narrow hash functions: Narrow hash functions are the weakest class of hash functions and generate output values that are so narrow (e.g. 16 bits) that the entire space of output values can be searched in a reasonable amount of time. For example, an 8-bit hash function would map any data block to a hash in the range 0 to 255. A 16-bit hash function would map to a hash in the range 0 to 65535. Given a particular hash value, it would be possible to find a corresponding block simply by generating random blocks and feeding them into the narrow hash function until the searched-for Value appeared. Narrow hash functions are usually used to arbitrarily (but deterministically) classify a set of data values into a small number of groups. As such, they are useful for constructing hash table data structures, and for detecting errors in data transmitted over noisy communication channels. Examples of this class: CRC-16, CRC-32, Fletcher checksum, the IP checksum.

Wide hash functions: Wide hash functions are similar to narrow hash functions except that their output values are significantly wider. At a certain point this quantitative difference implies a qualitative difference. In a wide hash function, the output value is so wide (e.g. 128 bits) that the probability of any two randomly chosen blocks having the same hashed value is negligible (e.g. about one in $10^{38}$). This property enables these wide hashes to be used as "identities" of the blocks of data from which they are calculated. For example, if entity E1 has a block of data and sends the wide hash of the block to an entity E2, then if entity E2 has a block that has the same hash, then the a-priori probability of the blocks actually being different is negligible. The only catch is that wide hash functions are not designed to be non-invertible. Thus, while the space of (say) $2^{128}$ values is too large to search in the manner described for narrow hash functions, it may be easy to analyse the hash function and calculate a block corresponding to a particular hash. Accordingly, E1 could fool E2 into thinking E1 had one block when it really had a different block. Examples of this class: any 128-bit CRC algorithm.

Weak one-way hash functions: Weak one-way hash functions are not only wide enough to provide "identity", but they also provide cryptographic assurance that it will be extremely difficult, given a particular hash value, to find a block corresponding to that hash value. Examples of this class: a 64-bit DES hash.

Strong one-way hash functions: Strong one-way hash functions are the same as weak one-way hash functions except that they have the additional property of providing cryptographic assurance that it is difficult to find any two different blocks that have the same hash value, where the hash value is unspecified. Examples of this class: MD5, and SHA-1.

These four classes of hash provide a range of hashing strengths from which to choose. As might be expected, the speed of a hash function decreases with strength, providing a trade-off, and different strengths are appropriate in different applications. However, the difference is small enough to admit the use of strong one-way hash functions in all but the most time-critical applications.

The term cryptographic hash is often used to refer to hashes that provide cryptographic strength, encompassing both the class of weak one-way hash functions and the class of strong one-way hash functions.

Exemplary embodiments of the present invention may employ hash functions in at least two roles:

1 To determine subblock boundaries.
2 To generate subblock identities.

Depending on the application, hash functions from any of the four classes above could be employed in either role. However, as the determination of subblock boundaries does not require identity or cryptographic strength, it would be inefficient to use hash functions from any but the weakest class. Similarly, the need for identity, the ever-present threat of subversion, and the minor performance penalty for strong one-way hash functions (compared to weak ones) suggests that nothing less than strong one-way hash functions should be used to calculate subblock identities.

The security dangers inherent in employing anything less than a strong one-way hash function to generate identities can be illustrated by considering a storage system that incorporates the invention using any such weaker hash function. In such a system, an intruder could modify a subblock (to be manipulated by a target system) in such a way that the modified subblock has the same hash as another subblock known by the intruder to be already present in the target system. This could result in the target system retaining its existing subblock rather than replacing it by a new one. Such a weakness could be used (for example) to prevent a target system from properly applying a security patch retrieved over a network.

Thus, while wide hash functions could be safely used to calculate subblocks in systems not exposed to hostile humans, even weak one-way hash functions are likely to be insecure in those systems that are.

We now turn to the ways in which hashes of blocks or subblocks can actually be used.

II. The Use of Cryptographic Hashes

The theoretical properties of cryptographic hashes (and here is meant strong one-way hash functions) yield particularly interesting practical properties. Because such hashes are significantly wide, the probability of two randomly-chosen subblocks having the same hash is practically zero (for a 128-bit hash, it is about one in $10^{38}$), and because it is computationally infeasible to find two subblocks having the same hash, it is practically guaranteed that no intelligent agent will be able to do so. The implication of these properties is that from a practical perspective, the finite set of hash values for a particular cryptographic hash algorithm is one-to-one with the infinite set of finite variable length subblocks. This theoretically impossible property manifests itself in practice because of the practical infeasibility of finding two subblocks that hash to the same value.

This property means that, for the purposes of comparison (for identicality), cryptographic hashes may safely be used in place of the subblocks from which they were calculated. As most cryptographic hashes are only about 128 bits long, hashes provide an extremely efficient way to compare subblocks without requiring the direct comparison of the content of the subblocks themselves.

Figure 28:
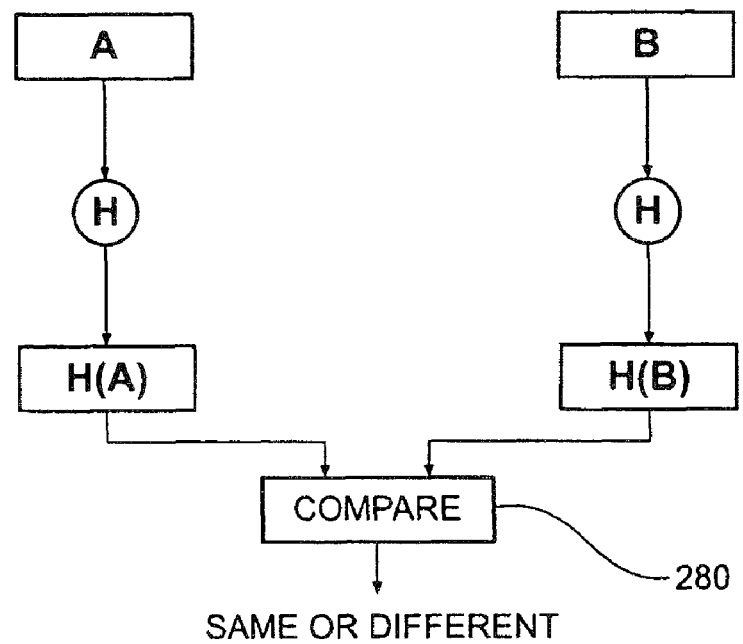
FIG. 28 shows how a cryptographic hash function H can be used to compare two subblocks A and B without having to compare A and B directly. Instead, their hashes H(A) and H(B) are compared.

Some of the ways in which cryptographic hashes are used in exemplary embodiments of this invention are:

Comparing subblocks: Cryptographic hashes H can be used to compare 280 two subblocks A, B without having to compare, or require access to, the content of the subblocks (FIG. 28).

Figure 29:
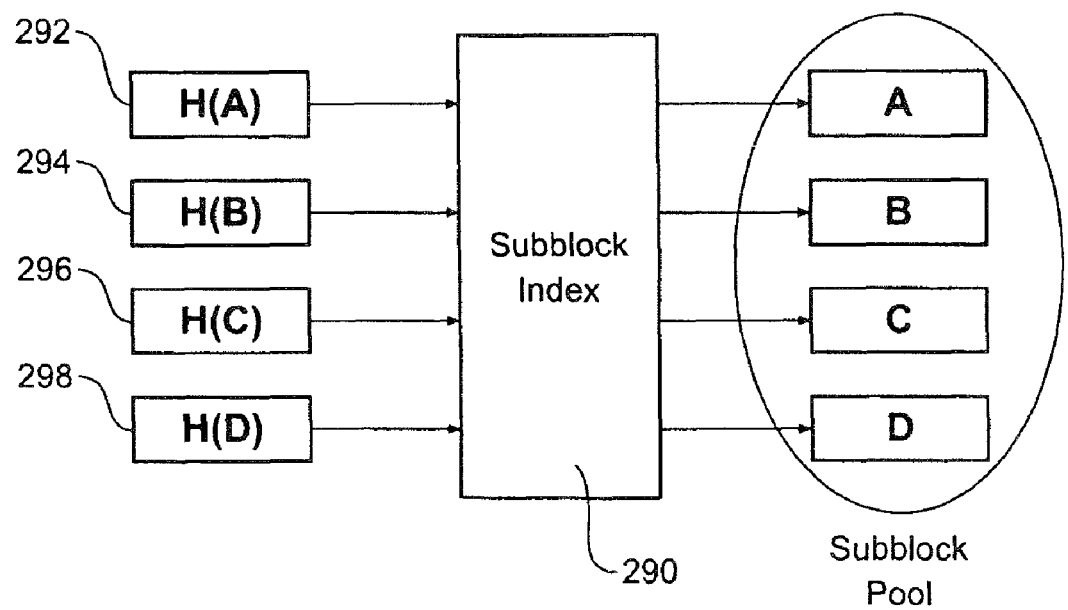
FIG. 29 depicts a subblock index that indexes subblocks A, B, C and D and whose keys are the hashes of subblocks (using hash function H) rather than the subblocks themselves.

Indexing subblocks: To index a collection of subblocks A, B, C, D, an index 290 can be constructed whose keys are the hashes of the subblocks 292, 294, 296, 298 (FIG. 29).

Figure 30:
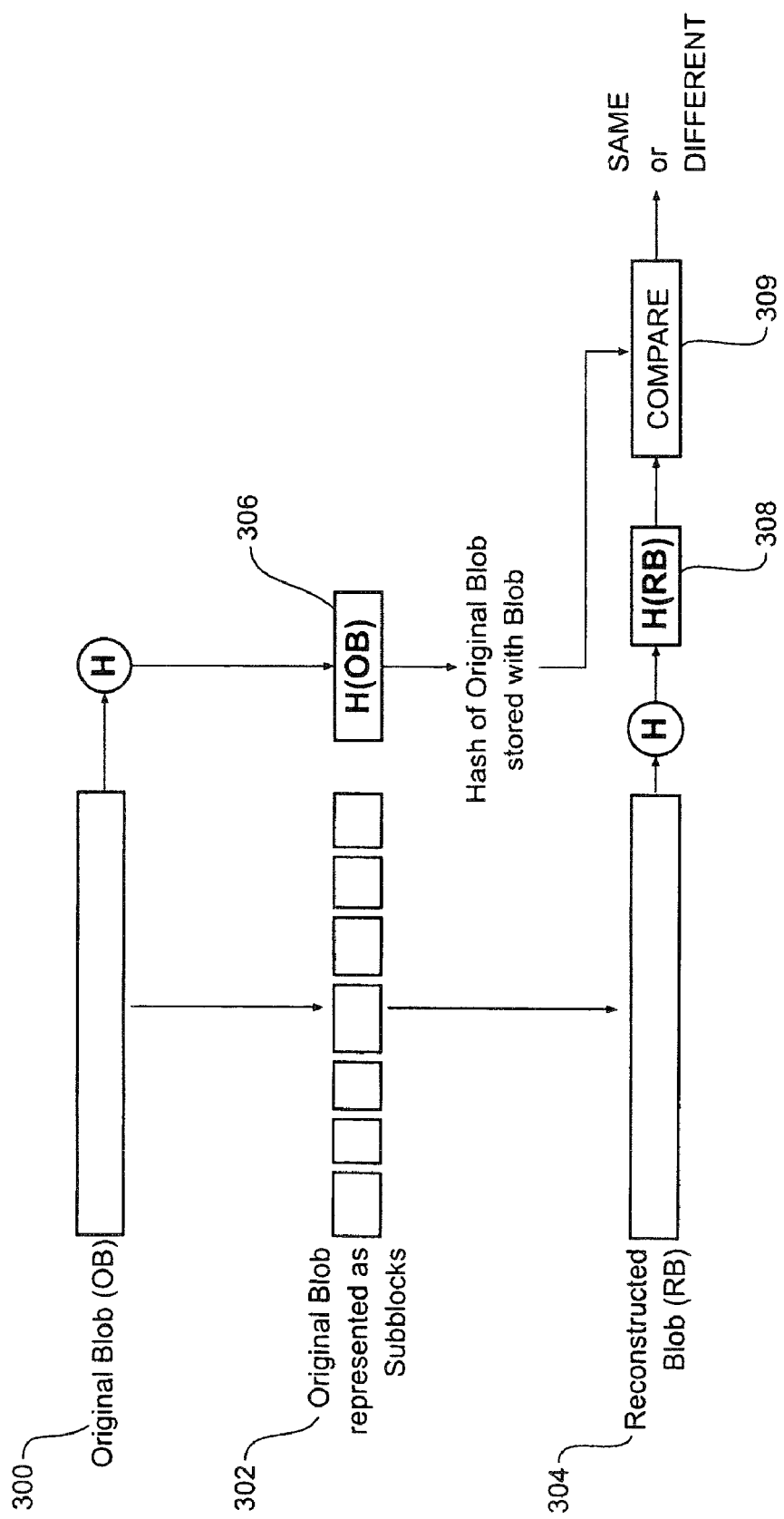
FIG. 30 shows how a cryptographic hash function H can be used to check that a BLOB has retained its integrity despite having been divided into subblocks and stored in a reduced-redundancy store. The original BLOB's hash is stored with the stored BLOB and is compared with the hash of the retrieved BLOB.

BLOB check: Cryptographic hashes can be used to ensure that the partitioning of a BLOB 300 into subblocks 302 and the subsequent reassembly of the subblocks into a reconstructed BLOB 304 is error-free. This can be done by comparing 309 the hash 306 of the original BLOB with the hash 308 of the reconstructed BLOB (FIG. 30).

III. Use of Hashes as a Safety Net

Embodiments of the present invention may add extra complexity to the storage systems into which they are incorporated. This increased complexity carries the potential to increase the chance of undetected failures.

The main mechanism of complexity is the partitioning of BLOBs into subblocks, and the subsequent re-assembly of such subblocks. By partitioning a BLOB into subblocks, a storage system creates the potential for subblocks to be erroneously added, deleted, rearranged, substituted, duplicated, or in some other way exposed to a greater risk of accidental error.

This risk can be reduced or eliminated by calculating the hash (preferably a cryptographic hash) of the BLOB before it is partitioned into subblocks, storing the hash with an entity associated with the BLOB as a whole, and then later comparing the stored hash with a computed hash of the reconstructed block. Such a check would provide a very strong safety net that would virtually eliminate the risk of undetected errors arising from the use of this invention (FIG. 30).

Another way to perform a check on a BLOB is to hash the concatenation of the hashes of its subblocks and check that value when retrieving the BLOB from the store. This method has the advantage that less data must be hashed overall and this could make such an embodiment more efficient.

IV. Storage of Subblocks within Clusters

Figure 7:
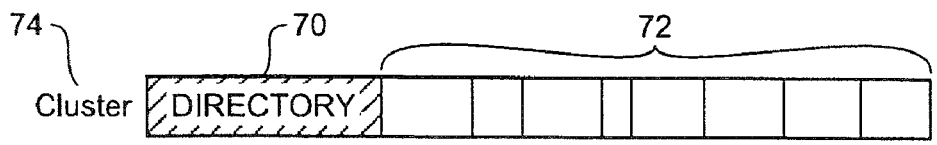
FIG. 7 depicts a cluster of subblocks that contains a subblock directory at the start of the cluster.

There are a number of ways in which subblocks can be stored within clusters. The term "subblock content" refers to the sequence of bytes that forms the actual subblock. In an exemplary embodiment, subblocks 72 in a cluster 74 are stored back-to-back with no intervening metadata (FIG. 7). In embodiments where the cluster does not have its own directory, back-to-back subblock content may be all that the cluster need contain.

An advantage of storing subblocks back-to-back is that contiguous runs of subblocks can be read from a cluster as a single sequential operation and the subblocks then held in memory and written out as a single sequential operation, without having to remove metadata first.

A number of methods can be used to determine how subblocks should be split into clusters. One method is to write subblocks to a cluster until it has at least S subblocks, where S is a predetermined constant. Another method is to write subblocks to a cluster until it contains at least M megabytes, where M is a predetermined constant.

V. Cluster Subblock Directories

A cluster can have a subblock directory that provides information about the subblocks within the cluster and allows subblocks within the cluster to be located quickly.

Figure 8:
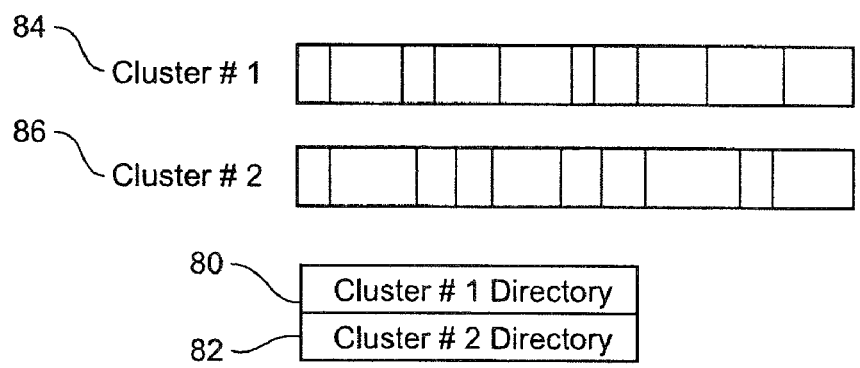
FIG. 8 shows how the directories of clusters may be stored separately from the clusters themselves.
Figure 9:
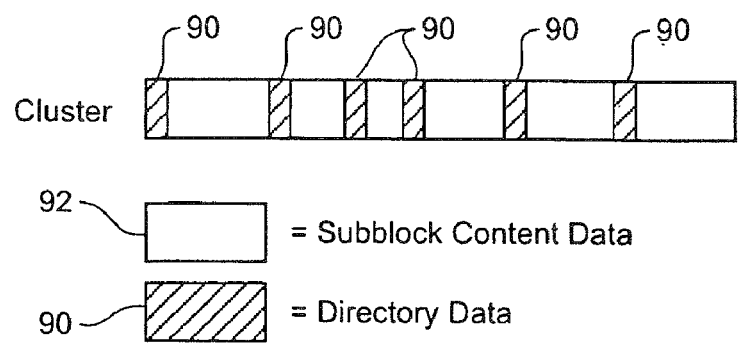
FIG. 9 shows how a cluster subblock directory's entries may be distributed throughout the cluster.
Figure 10:
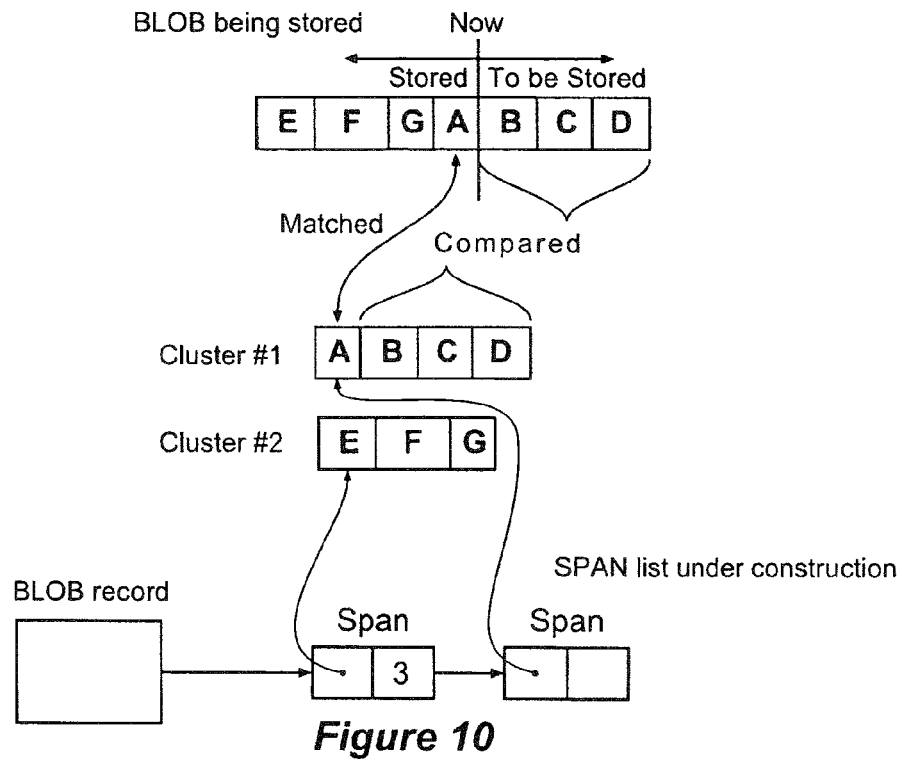
FIG. 10 depicts an aspect of storing a BLOB where, following the discovery that subblock A (of the BLOB being stored) is already present in cluster #1, the subsequent subblocks in the BLOB (B, C and D) can be compared to the subblocks that follow A in its cluster (here again B, C and D), thereby avoiding having to lookup B, C and D in the subblock index.

If the cluster has a directory 70, the directory could be placed at the start of the cluster (FIG. 7) or end of the cluster. Another alternative is to interleave the directory 90 entries with the subblock content 92 (FIG. 9). Finally, the directory 80, 82 can be stored separately (FIG. 8).

One simple option is to place an upper limit L on the number of subblocks in a cluster and represent directories as a count plus an array of L directory entries, regardless of the number of subblocks in the cluster. This yields a fixed-length directory 80, 82, allowing the directories of the clusters to be stored in a single array separately from the remaining cluster content 84, 86 (i.e. subblock content) (FIG. 8).

VI. Subblock Metadata in Cluster Subblock Directories

A cluster's subblock directory could store the length of each subblock. Typically this would be measured in bytes. If the length of each subblock is stored, the cluster's subblock content can be separated into subblocks without having to invoke the partitioning method to determine where the boundaries are between subblocks.

A cluster's directory could store the hash of each subblock. For example, a directory could store the 128-bit MD5 or 160-bit SHA-1 hash of each subblock in the cluster. Storing the hash of each subblock X is useful because, during storage, it allows the system to confirm that a newly arrived subblock Y has been found in a cluster without having to compare the contents of subblock X with the contents of subblock Y. Instead, the system calculates the hash of subblock Y and compares it to the hash of subblock X (which can be found in its cluster's directory). Thus, subblocks in BLOBs being stored can be tested for presence in the store using just the index and the cluster directories, with no need to read the content of subblocks in the store.

A cluster's directory could also store a subblock identifier for each subblock. The subblock's identifier is unique within the set of subblocks within the cluster. One simple way of implementing subblock identifiers is to choose a fixed width (e.g. 16 bits), allocate a serial number counter within each cluster, and start from zero and allocate the next integer to each subblock as its serial number identifier. When the counter reaches its maximum value, the cluster can simply be closed to new data. Alternatively, if subblocks have been deleted from the cluster, unused identifiers may be reallocated. This is one of many ways to implement a subblock identifier.

Figure 27:
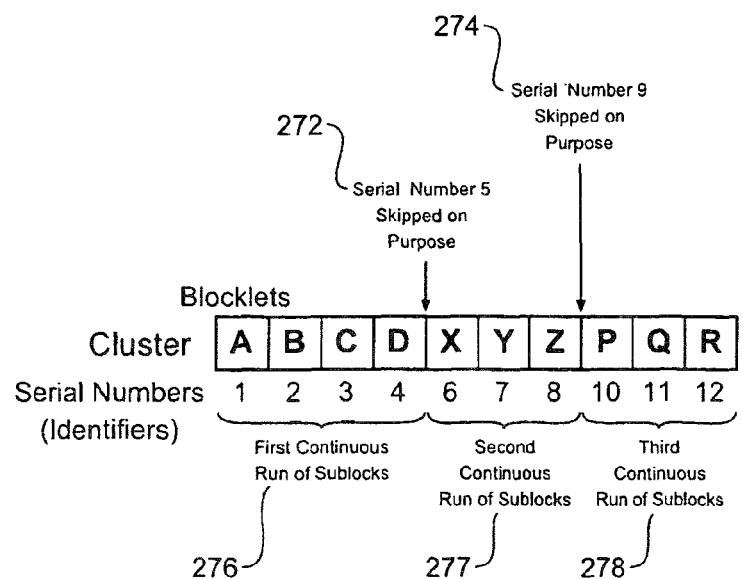
FIG. 27 shows the purposeful skipping of subblocks serial numbers within a cluster so as to identify runs of subblocks that appear contiguously in the original BLOBs.

If serial numbers are used as subblock identifiers, their contiguity can be used to indicate the start and end of runs of subblocks 276-278 in a cluster that were stored from a single run of subblocks in a BLOB. In one embodiment, this is achieved by skipping (wasting) a serial number at the end of each stored run 272, 274 (FIG. 27). If serial numbers are not used, a Boolean value can be added to each subblocks's metadata to indicate the end of (with respect to the subblock run within the originating BLOB) subblock runs within the cluster.

VII. Compression of Clusters

There are a number of ways in which compression (e.g., without limitation, GZip) could be incorporated into the system. One simple method is to apply compression as a single sequential operation on each cluster before it is written to disk. Another method is to compress each subblock individually. Another method is to compress each run of subblocks with contiguous serial numbers.

Clusters could be stored on disk in a compressed form. They could also be stored in memory in a compressed form.

VIII. Span Subblock-Run Identification

Each span identifies a run of subblocks within a particular cluster. In exemplary embodiments, the span contains information that identifies the cluster containing the run of subblocks. There is a greater range of possibilities for identifying the run of subblocks. For this, either the first and last subblock in the run can be identified, or the first (or last) subblock identified and a length provided. The length could be measured in bytes or subblocks.

To identify a subblock in an exemplary embodiment, a span may use the subblock's hash (in which case the cluster would have to be searched for the subblock (using the subblock's directory (if it has one)), the subblock's position within the cluster (e.g. "the third subblock") or the subblock identifier.

Hashes are relatively wide. If there were (say) 1000 subblocks within a cluster, the subblock identifier should only need to be about 10 bits wide, yet a typical hash is 128 bits wide. Use of the position (measured in subblocks) of a subblock within its cluster is more space efficient, but breaks down if subblocks are deleted from the cluster (as might happen if a BLOB containing the subblocks is deleted from the store). To avoid this, in exemplary embodiments, a unique identifier can be allocated to each subblock in the cluster (unique within the cluster). This identifier can be stored with each subblock's metadata in the cluster's directory. Such an identifier can be narrow enough (in bits) but still distinctly identify a subblock, even if the subblocks are shifted within the cluster.

Another approach is to refer to subblocks by their hash, but to store the smallest number of hash bytes that are required to distinguish the subblock from all the other subblocks in the same cluster. A small fixed-length field in the span record could be used to record how many bytes of hash are recorded. This method eliminates the need for subblock identifiers, yet does not burden the span records with lengthy hashes. The method causes span records to have variable length. One potential problem with this method is that subblocks that are added to a cluster could cause existing references to become ambiguous. This problem can be overcome by noting such ambiguous references will always refer to the first subblock that satisfies the ambiguous reference.

Another method is to use subblock serial numbers, but to allocate them only to subblocks that are directly referred to by a span. As, in practice, very few subblocks are the first subblock of a span, a far smaller number of serial numbers would need to be stored.

IX. Partial Subblock Matching

Figure 17:
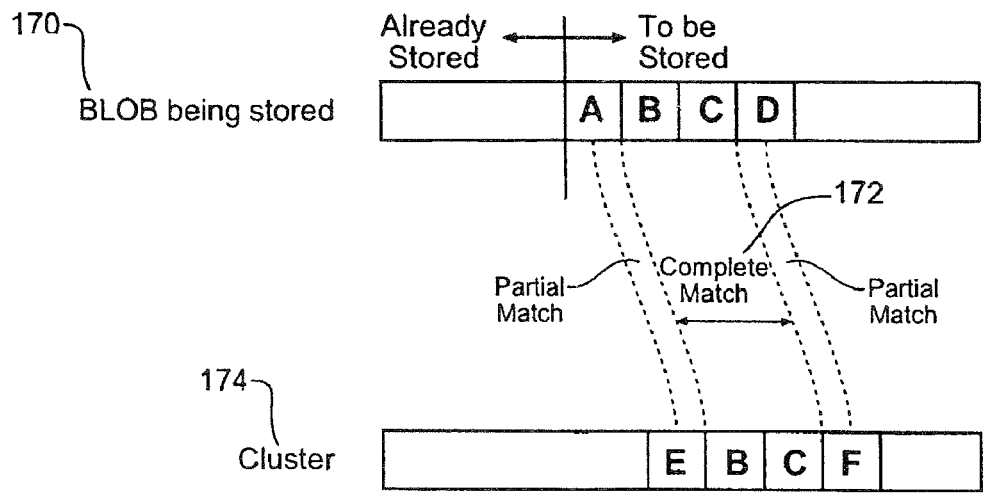
FIG. 17 shows how the subblocks at either end of a matching run can be compared directly to see if there are any partial matches.

During the storage of a BLOB 170, when a run of one or more matching subblocks B, C (the "matching run") 172 is found within a cluster 174, it is likely that some part of the non-matching subblocks on either side of the run of matching subblocks will match the corresponding parts of the corresponding subblocks in the BLOB being stored. FIG. 17 shows a BLOB 170 that is being stored and a cluster 174 against which it is being compared. Using indexing, a matching run of subblocks BC has been found. The subblocks on either side do not match. A does not match E, and D does not match F. So the matching run is just two subblocks long. However, having discovered the BC match, the surrounding subblocks can be compared at a finer grained level.

Comparing the end of subblock A with the end of subblock E reveals that they share the same (say) 123-byte suffix. Similarly, comparing the beginning of subblock D with the beginning of subblock F reveals that they share the same (say) 1045-byte prefix. These are called partial subblock matches.

Figure 18:
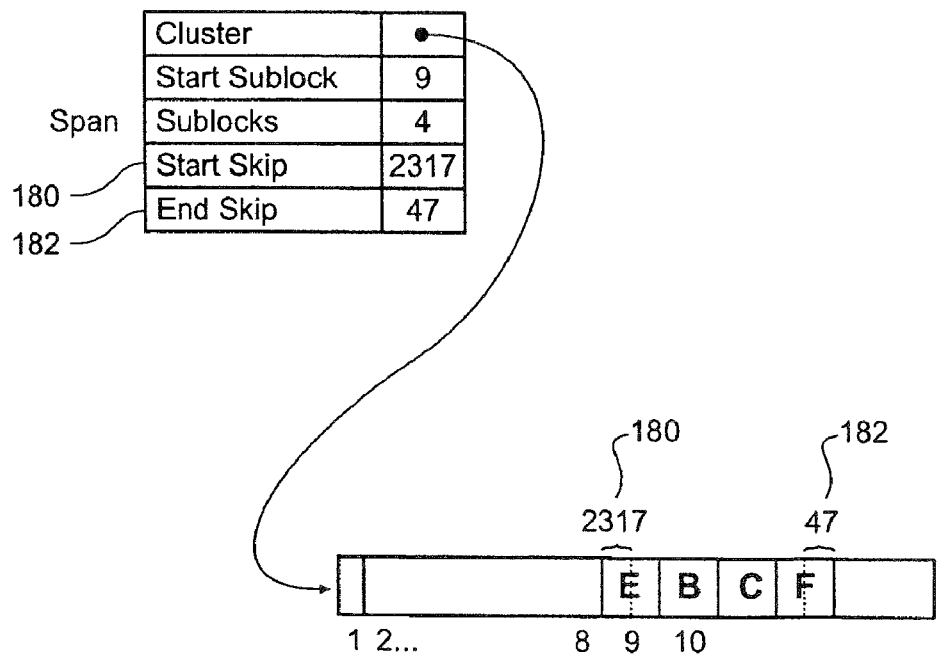
FIG. 18 shows how span records could be augmented with two additional fields "Start Skip" and "End Skip" (each of which holds a byte count) to represent a nm of subblocks that includes partial subblocks at the ends of the run.

Once a partial subblock match has been found, there are a number of ways in which it can be exploited. FIG. 18 shows how the span record structure could be augmented to include two extra fields "Start Skip" 180 and "End Skip" 182 that record the number of bytes that should be ignored at the beginning of the first subblock in the span and the end of the last subblock in the span. An alternative is to use two fields "Start Extend" and "End Extend" that record the number of bytes to extend either end of the subblocks. An embodiment may choose to use either or both of each of the above fields.

Another way to refer to a range of bytes within a run of subblocks is to replace the End Skip field with a length being the total number of bytes in the span.

X. Reducing Fragmentation

If the BLOB being stored contains many subblocks that are already in the store, but are scattered throughout many different clusters, the BLOB will end up being represented by a list of spans that point all over the disk. It will, in short, be highly fragmented.

Figure 19:
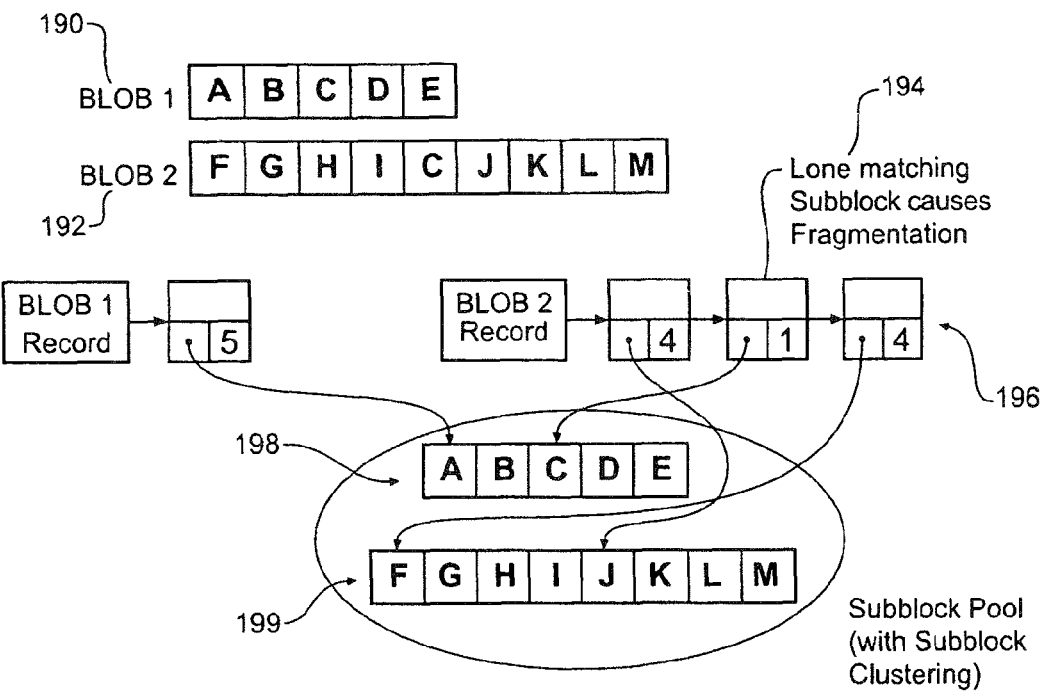
FIG. 19 shows how, when a BLOB is stored, an isolated matching subblock (C) can cause fragmentation in the representation of the BLOB.

One particularly unfortunate form of fragmentation occurs when a single subblock matches within a long run of non-matching subblocks. FIG. 19 depicts an example of this where BLOB1 190 has already been stored in the store and BLOB2 192 is being stored and where a single matching subblock C appears within an otherwise non-matching run of subblocks F-M in BLOB2. The result is that a single span record 194 for the matching subblock is created in the span list 196. This kind of fragmentation is likely to increase BLOB2's retrieval time because a random disk access will have to be performed to access the first cluster 198 as well as the second 199.

Figure 20:
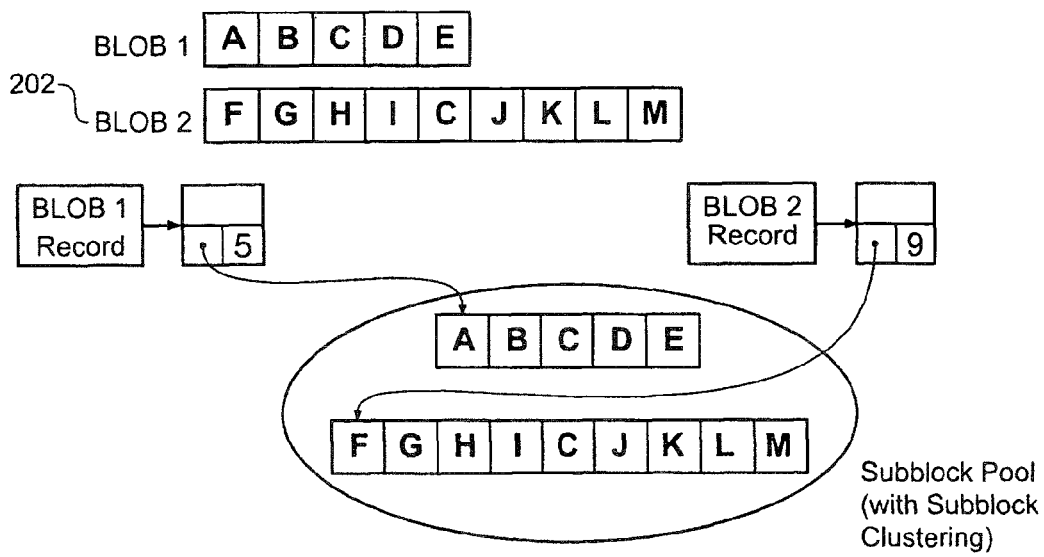
FIG. 20 shows how fragmentation can be avoided by choosing to store an isolated subblock (C) in the store twice.

Some embodiments can avoid this kind of single-matching-subblock fragmentation by treating isolated matching subblocks as not matching, and to store them a second time. FIG. 20 shows how ignoring the isolated match of subblock C causes it to be stored twice, using extra space, but reducing fragmentation for BLOB2 202. This method can be generalized by ignoring all matching runs of less than a predefined threshold T of matching subblocks. In some embodiments, any value of T greater than one is likely to reduce fragmentation; even a value of two would be helpful.

XI. BLOB Table

A storage system that stores BLOBs will need to provide some way to allow its user to refer to BLOBs so that they can be retrieved.

Figure 11:
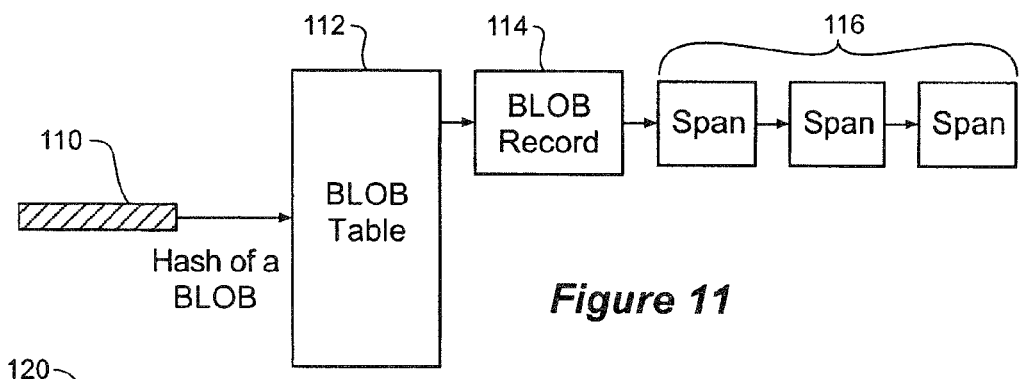
FIG. 11 depicts a BLOB table that maps BLOB hashes to BLOB records each of which contains (or refers to) an ordered list of spans that identify the subblocks in the BLOB.

One method is to use the hash 110 of a BLOB as its identifier (FIG. 11). Thus, a user would submit a BLOB to the storage system and make a note of the hash of the BLOB (e.g. the MD5 hash). To retrieve the BLOB, the user would present the hash to the storage system, and the system would return the BLOB.

Another method is to assign arbitrary names to each BLOB. Conventional file systems do this.

Whatever naming scheme is adopted must be implemented. Such an implementation will consist essentially of a mapping from the BLOB 112 namespace to the BLOB records 114 themselves (which contain (or refer to) lists of spans 116 (FIG. 11). This mapping can be achieved using all kinds of conventional data structures such as digital search trees, B trees and hash tables.

XII. Lists and Trees of Spans

Each BLOB 114 record referenced by the BLOB table 112 will contain any metadata of the BLOB and will either contain, or point to an ordered sequence of span records 116 (FIG. 11), each of which identifies a [contiguous] run of subblocks within a cluster.

Figure 26:
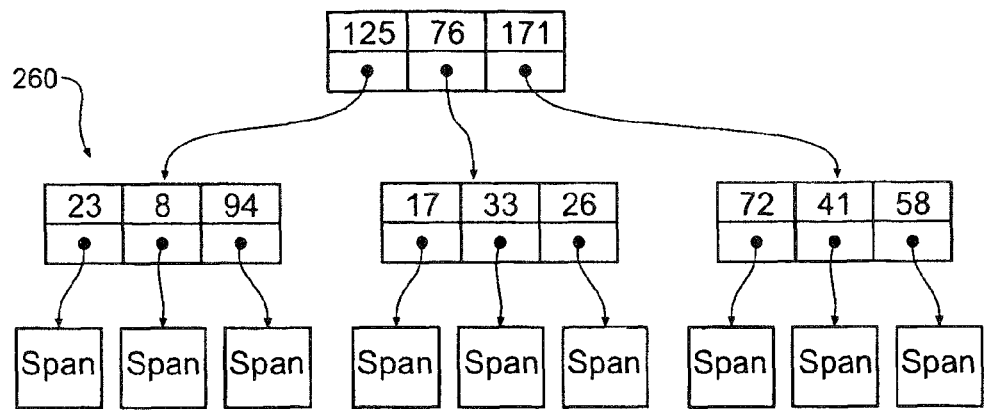
FIG. 26 depicts a tree of spans with a furcation of three. Organising spans into a tree makes random access within a BLOB fast. The numbers in the diagram are the lengths of the blocks represented by respective child nodes.

Keeping spans in an ordered list of spans makes it efficient to retrieve an entire BLOB sequentially, but requires a linear search in order to perform a random access read on the stored BLOB (or a binary search if the span records can be accessed randomly). To speed up random access reads, a BLOB's spans can be organised into a tree structure. FIG. 26 shows an example of a tree with a furcation of three (though any furcation could be used). Each non-leaf node represents a finite block of bytes which is the concatenation of the blocks represented by its child nodes. Each node contains three lengths which are the lengths of the blocks its child nodes represent. Each leaf node consists of a span 260 which identifies a sequence of one or more subblocks within a cluster. A random access read of bytes J through K of the stored BLOB represented by such a tree can be performed by moving down the tree to find the spans that contain bytes J through K and then retrieving the subblock content bytes from the clusters.

XIII. Subblock Index

A subblock index (FIG. 5) makes it possible to determine whether a particular subblock is already present in the store without performing a linear search of all the clusters in the store. The index can also provide information that assists in locating the matching subblock.

The index 50 can be viewed as an organised collection of entries, each of which binds an index key to an index value. Entries could be stored in the index explicitly as entry records (each consisting of a key field and an value field) or implicitly (if, for example, the index is organised as a binary digital search tree on the keys with the values in the leaf nodes).

The index keys could be the subblock's content, the hash of the subblock's content or just part of the hash of the subblock's content. Storing just part of the hash of the subblock's content (e.g. the first eight bytes of an MD5 hash rather than the entire sixteen bytes) can reduce the size of the index at the expense of the occasional collision. If more than one subblock has the same partial-hash, then the index must be capable of storing and retrieving both entries.

The index values should consist of a piece of information that assists in locating the subblock within the store. In one embodiment extreme, the value could provide a precise reference, consisting of a cluster number and information that identifies a particular subblock within the cluster (e.g. an identifier, subblock serial number or subblock hash). At the other embodiment extreme, the index value could consist of just a cluster number. Once the cluster number of a subblock is known, the cluster directory can be searched to find the subblock in the cluster, if it is there. To save even more space in the index, the index value could consist of only part of the cluster number (e.g. all but the bottom two bits of the cluster number), which would require more than one cluster to be searched.

A good combination of choices is to make the index keys the top eight bytes of the subblock hash and the index value the number of the cluster containing the subblock. So long as there is a directory for each cluster, these choices keep the index size down while still providing fast access to any subblock in the store.

The index can be implemented by a variety of data structures including a digital search tree, binary tree, and hash table.

XIV. Storing the Index

The index can be stored in memory or on disk. Reducing the size of the index is important if the index is held in memory. Experiments show that, in some embodiments, the system runs much faster if the index is held in memory. Not having to store information identifying the position of the target subblock within a cluster reduces the size of the index significantly. Therefore, typical embodiments store only the cluster number in the index.

XV. Use of a Hash Table for the Subblock Index

As the subblock index is so critical in determining the speed of a reduced redundancy storage system, it is important that this data structure be designed to provide the fastest possible access. A hash table provides a very good data structure for a subblock index as it provides access in O(1) time. However, this hash speed access comes at a price. The next few sections address the challenges that a subblock index Poses.

XVI. Hash Table Collisions

This section contains a discussion of hash table collisions, and applies only if the index is implemented using a hash table.

Figure 21:
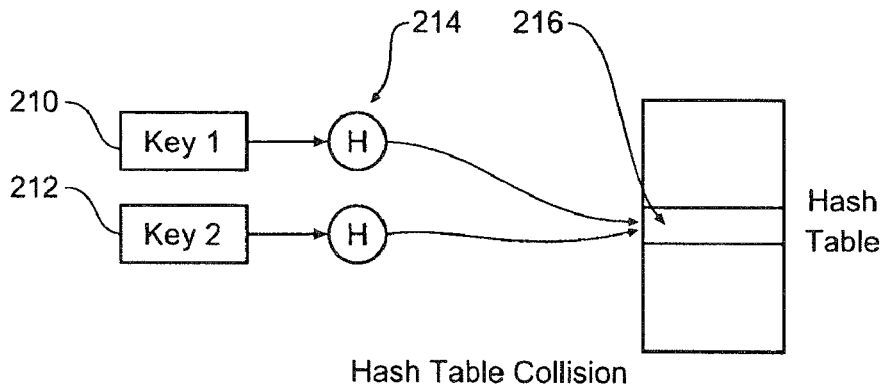
FIG. 21 depicts a hash table collision in which two keys hash to the same position in the table.

A collision occurs in a hash table when two keys 210, 212 hash 214 to the same position (slot) 216 (FIG. 21). One way to address this situation is simply to throw away the second entry. This can be an appropriate choice in some contexts. However, if the hash table is not allowed to be lossy, this option cannot be used, and one of a wide variety of techniques can be employed to deal with this "overflow" situation.

Figure 22:
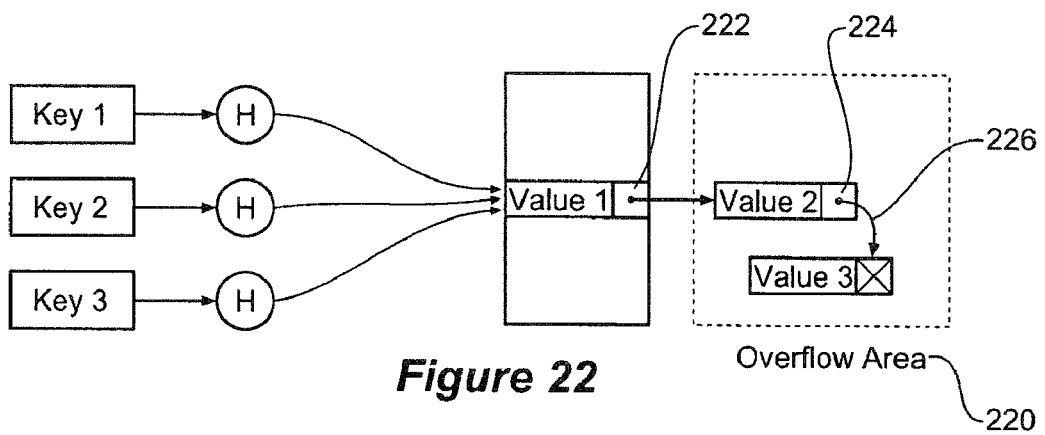
FIG. 22 depicts a hash table with an external overflow list.

One classic technique for dealing with a collision is to have a separate storage area called an overflow area 220. Each hash table slot contains an overflow field 222. If a collision occurs in the slot, the overflowing entry 224 is stored in the overflow area and a pointer to the entry is placed in the slot 222 (FIG. 22). The overflow area allows entries to point to each other too 226, allowing each overflowing slot to point to a list of entries (FIG. 22). This technique works well if a separate overflow area is available (as it might be in the form of a memory heap if the hash table were in memory). However, if the hash table is on disk, placing overflowing entries in an overflow area will usually involve performing at least one random access seek, which is very slow.

A cleaner approach to collisions is to store the colliding entry in the hash table itself. In a classic approach, when a collision occurs, the second item's key is hashed using a second hash function and the resultant slot examined. If it is empty, the entry can be stored there. If it is not, a third hash function can be invoked and so on until an empty slot is found. If the entire table is full, then the table will have to be split before the new entry can be added. In general, a hash function H(K,X) can be defined where K is the key to be hashed and X is a positive integer which can be increased to find successive candidate locations in the hash table for a colliding entry. To search for a key K, slots H(K,X) are examined for X=1,2, . . . until a slot containing the key is found, or an empty slot is encountered (which indicates the end of the hash overflow chain within the table).

Figure 23:
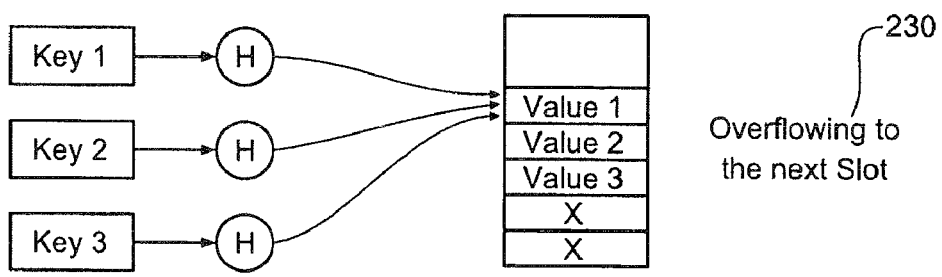
FIG. 23 depicts in-table overflow where overflowing entries are stored in the next empty slot.

The problem with this approach is that, if the hash table is large and on disk, following a collision chain requires performing a series of random access seeks on the disk, which is extremely time consuming. This can be avoided by defining H(K,X)=H(K,X−1)+1; in other words, overflowing to the next adjacent slot 230 (FIG. 23) (and wrapping around at the ends of the table). This technique keeps the accesses local. If, when reading the first slot accessed, the next S slots are read as well, for small S the disk operation will take no extra time (e.g. reading 1K instead of 12 bytes) and will provide the overflow slots as well. Once the new entry is added, the slots can also be written back to disk as a group. The value S can be adjusted (possibly dynamically) so as to ensure that it is rare for a collision chain to span more than S slots (and thereby require an additional disk access).

XVII. Hash Table Buckets

Figure 24:
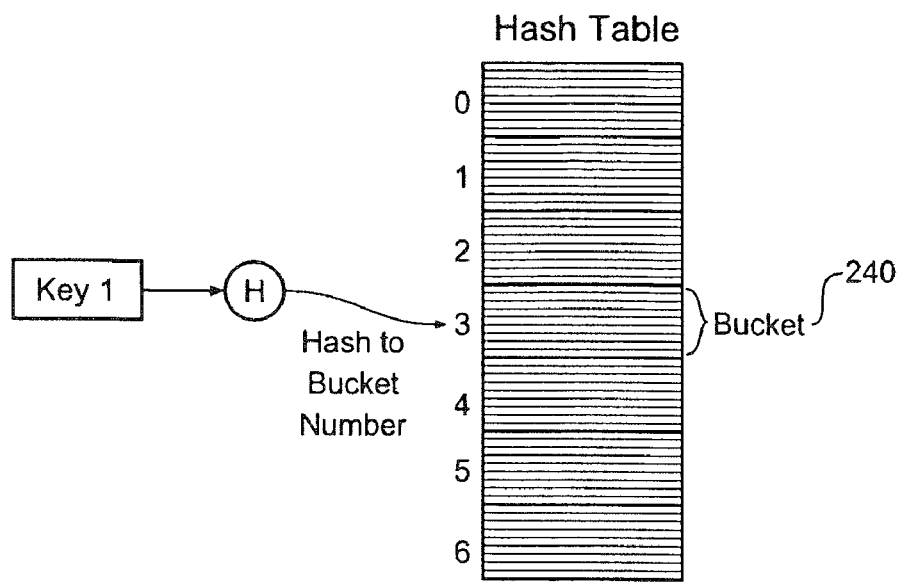
FIG. 24 depicts a hash table organised as an array of buckets, each of which contains a fixed number of entry slots.

If the index is stored on disk, random access reads and writes to the index can be time consuming. So if there is a chance of an overflow from one slot into another, it makes sense to read and write more than one slot at a time. One way to do this is to divide the table into buckets 240 (FIG. 24) and read and write buckets instead of entries. For example, one could replace a table of 1024 slots with a table of 64 buckets each of which contains 16 slots. To search for an entry, a bucket can be read and a linear search performed within the bucket (or possibly a binary search if the keys in the bucket are sorted). Only occasionally will a bucket fill, in which case the overflow can move to the next bucket. So long as the table is not allowed to grow too full, overflow chains should not become very long.

XVIII. Hash Table Growth

One problem with using a hash table is that when it fills up, there is no obvious way to expand it.

One approach to this problem is simply to never allow the table to become full. This can be done by initially creating a hash table so large that it never becomes full in the particular application. However, in some applications, it may not be possible to predict the load on the hash table in advance, so other solutions must be found.

One approach is to abandon the hash table by creating a new larger hash table and transferring all the entries in the old table to the new table. This is a perfectly feasible approach so long as there is enough memory to hold both tables during the transfer.

Figure 25:
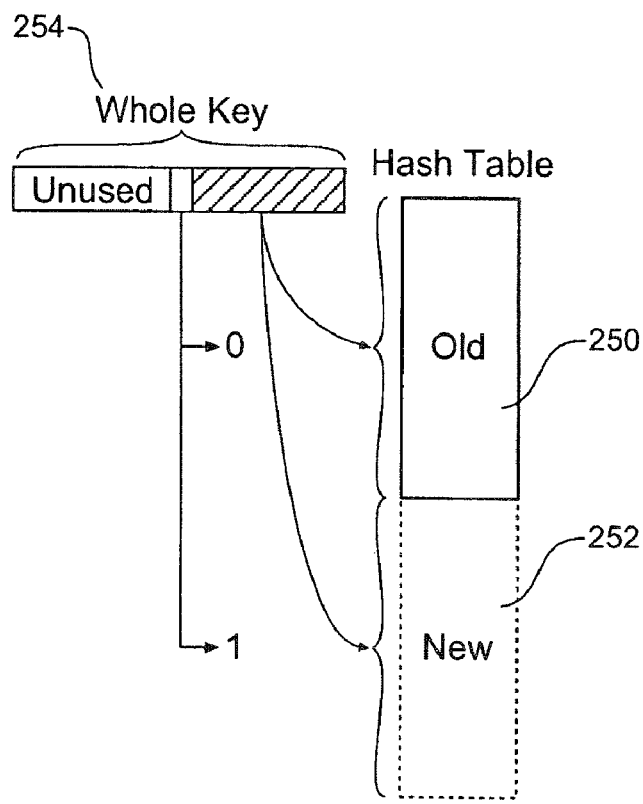
FIG. 25 shows how a hash table can be doubled in size by using an extra bit of the whole key.

Another approach is to double the size of the hash table whenever it becomes full, and transfer (about) half of the entries in the first (old) 250 half to the second (new) 251 half. FIG. 25 shows how this can be done. If the initial hash table has $2^K$ entries, then the bottom K bits of the whole key can be used to index the table. If the table becomes full, it can be doubled. The new table will use the K+1 lowest bits of the whole key 254 as a key. The extra bit of the key that is now used (bit K) distinguishes between the old and new halves of the doubled table. The leftmost rest of the whole key remains unused. All that remains to be done is to move the entries in the old half of the doubled table whose bit K is 1 to the corresponding position in the new half. In fact, overflow makes it a bit more complex than this. First, overflow may mean that an entry is not in its "natural" position in the old half of the table, so simply moving all the entries with bit K set would move some entries to incorrect positions. This means that they need to be rehashed. Second, the removal of entries in the old half might cut some overflow chains, rendering some entries inaccessible. So when an entry is moved, the overflow chain of that entry has to shuffle back to fill the gap.

XIX. Subblock Index Partial Key Storage

One way to reduce the size of the index is not to store a copy of the index's key in each index entry. For example, if the index keys are 128-bit MD5 hashes (of the subblocks), then one way to reduce the size of the index is to record only part of the key in the entries of the index.

Figure 12:
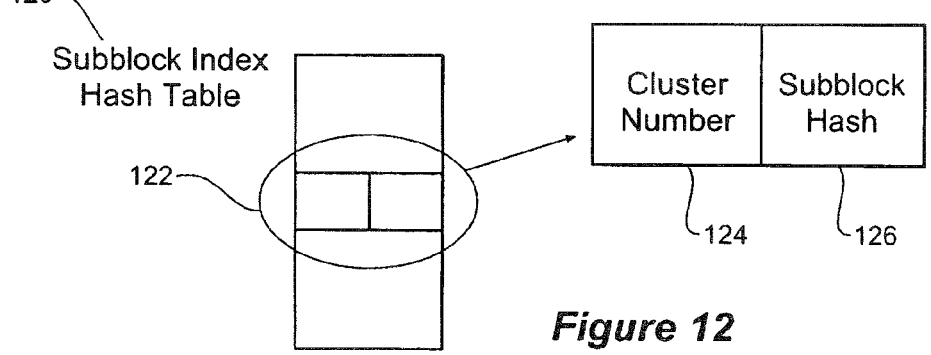
FIG. 12 depicts a subblock index hash table and shows an entry of the table.
Figure 13:
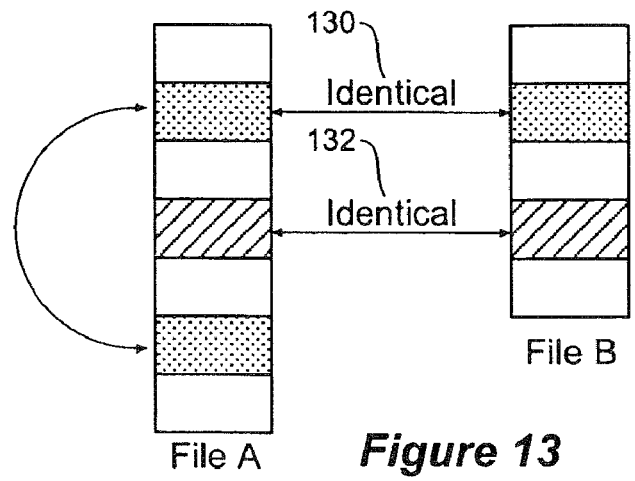
FIG. 13 (prior art) depicts two files that contain two instances of the same sub-sequences of data. In addition, File A has identical data within itself.
Figure 14:
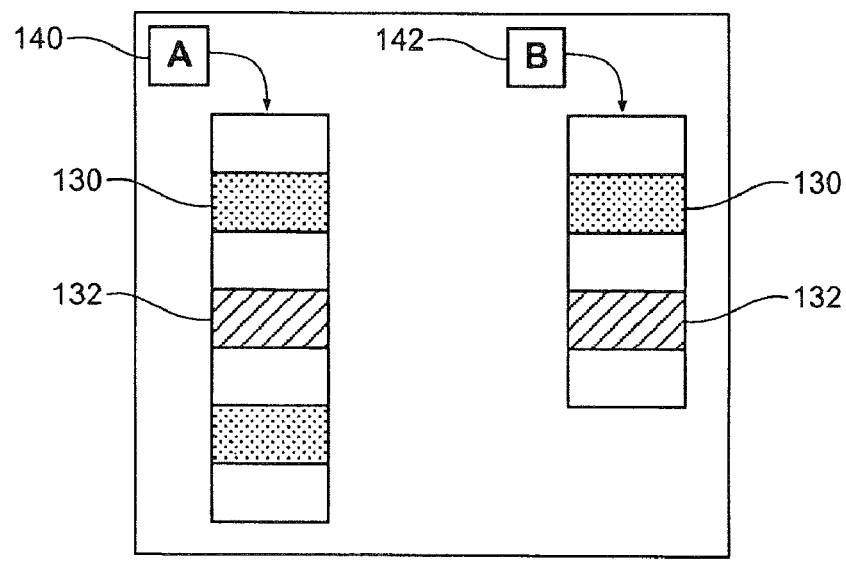
FIG. 14 (prior art) shows how conventional storage systems store files without attempting to identify their common data.
Figure 15:
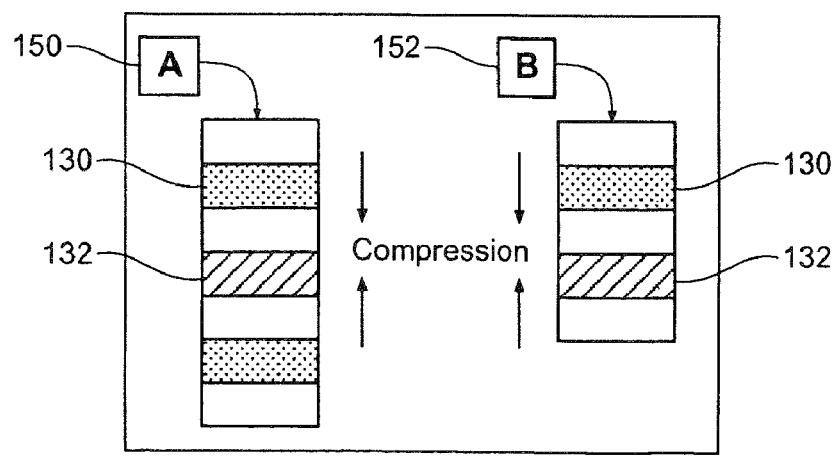
FIG. 15 (prior art) shows how conventional data compression will reduce the size of each BLOB but will not identify the common sequences of data between BLOBs.
Figure 16:
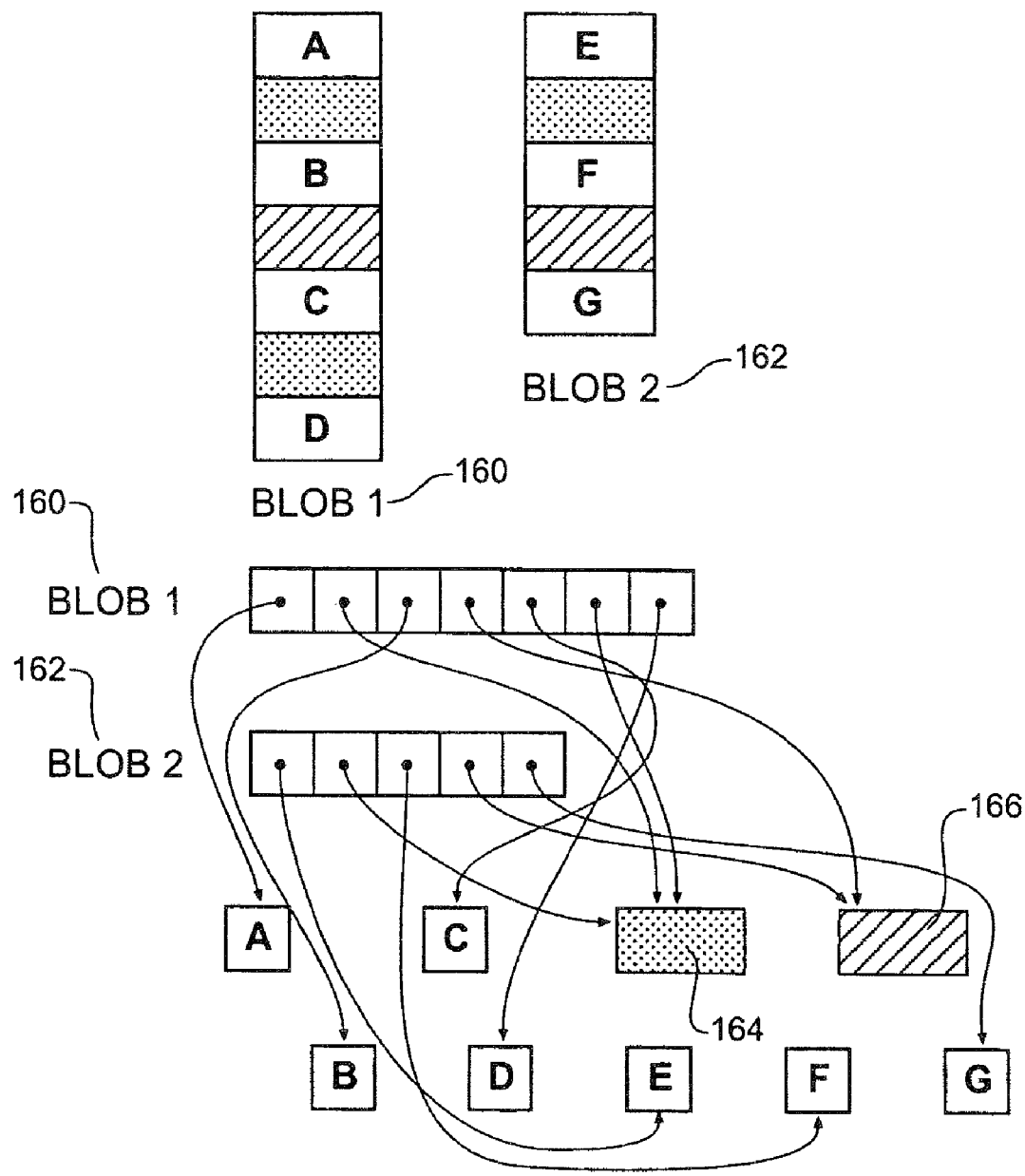
FIG. 16 shows how the representation of two BLOBs that contain the same sequences of data can refer to those sequences of data so that the sequences only need to be stored once.

For example, if the index were implemented as a hash table 120, each hash table entry 122 would typically contain a cluster number 124 and a copy of the subblock hash 126 (FIG. 12). This would ensure that if two subblocks hashed to the same position in the index's hash table, the two entries would be distinguishable. However, if the hashes were 128 bits wide and only 64 bits of each hash were to be stored, then the entries would still remain distinguishable yet would consume half the space.

In the extreme case, the hash table would not contain any part of any key. Instead, each subblock hash would hash to a position in the hash table and all the clusters found at that position would have to be searched. This is still far better than a linear search of all the clusters in the store.

The best approach is to store some part of the hash, but not all of the hash. This means that, on rare occasions, there may be more than one matching entry in the hash table and all of the clusters referred to by the set of matching entries will have to be searched. Storing only part of the hash in the entries provides enough differentiation to avoid having to check several clusters but still uses significantly less space than a complete hash.

XX. BLOB Deletion

In some applications, there will be a need to delete BLOBs as well as store them. Deleting BLOBs can become involved because the obvious approach of simply deleting all the subblocks referenced in the BLOB's spans (and then deleting the BLOB's spans and BLOB record) fails because such an action could delete subblocks that are also part of other (non-deleted) BLOBs. A more sophisticated approach is desirable.

One approach to BLOB deletion is to add an extra piece of metadata to each subblock in the store: a reference count. A subblock's reference count stores the number of spans (in all BLOBs) that include the subblock. Under a reference counting approach, a subblock's reference count is incremented when a new span is created that includes the subblock (i.e. during BLOB storage) and is decremented when such a span is deleted (i.e. during BLOB deletion). A subblock can be deleted when its reference count falls to zero.

The reference count approach allows the storage system to provide BLOB deletion functionality. However, the user might not need this functionality. An alternative to reference counting is an expiry system. In this system, each BLOB and each subblock has an expiry date. When a BLOB is stored, the user provides an expiry date and the BLOB is added, and a new list of spans created for the BLOB. As part of the addition process, the subblocks referred to by the span list have their expiry dates set to the maximum of their previous expiry date and the date of the BLOB that is newly referencing them. Once BLOBs and subblocks are labelled with expiry dates, a background process can delete expired BLOBs and subblocks at will.

XXI. Embodiments Using an Existing File System

Figure 31:
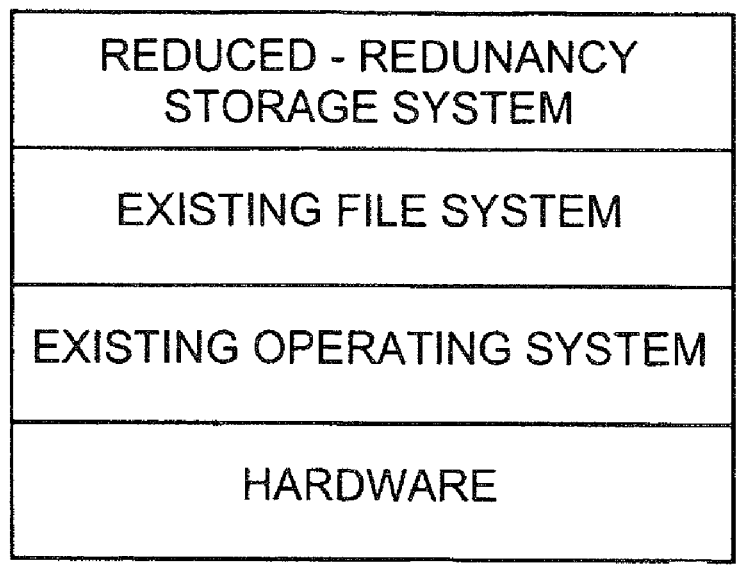
FIG. 31 depicts an embodiment in which a reduced-redundancy storage system is implemented using ("on top of") an existing file system.

Embodiments of the present invention could be implemented on top of an existing file system. FIG. 31 shows how this could be organized.

Figure 34:
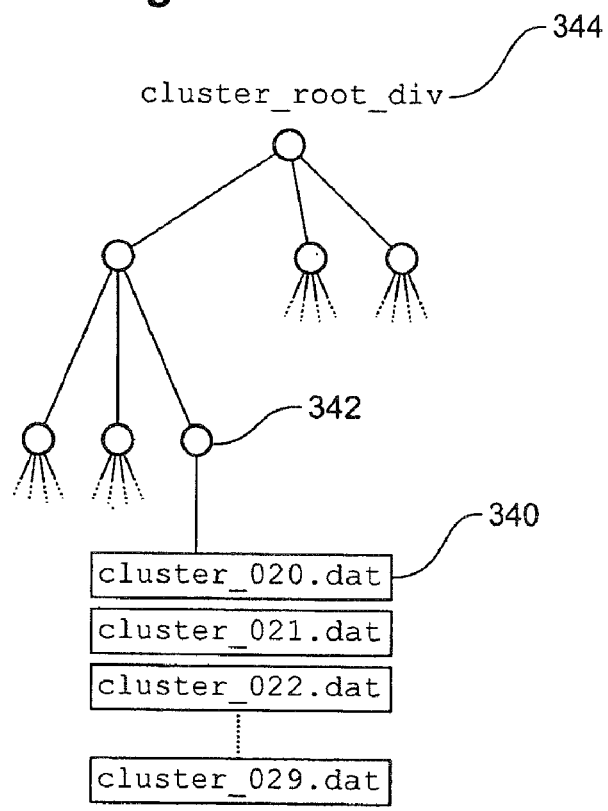
FIG. 34 shows how a collection of clusters could be stored in a corresponding collection of files in an existing file system. In this example, a directory tree forms a decimal digital search tree on the cluster numbers.

In such an embodiment, each cluster could be stored in a single cluster file 340. If clusters are numbered, the name of each cluster file could include the cluster number. The cluster files could be stored in a single directory 342, or a tree of directories 344 (FIG. 34). A cluster could be modified directly by performing random access read and write operations upon its file, or could be modified by reading the cluster file completely into memory, modifying it, and writing the entire file back to disk using a sequential IO operations.

Figure 33:
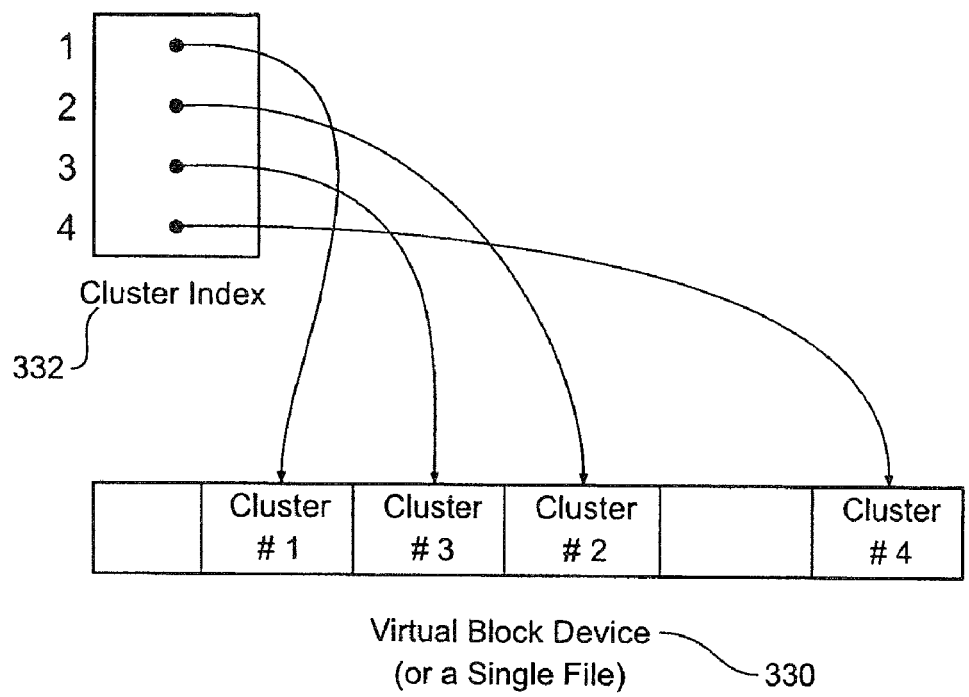
FIG. 33 shows how clusters of varying lengths could be stored inside a single block device or a single file in a file system. A cluster index could be used to find a cluster quickly by its number.

Another embodiment could employ an existing file system; but use only a single file. The clusters could be stored within the single file contiguously 330 and located using a cluster index 332 held in memory (FIG. 33).

If fixed-length cluster directories are employed, the entire set of cluster directories could be stored in a single file that stores the directories as an array, allowing random access to a particular directory using a random access to the file.

Each BLOB could be stored in a file whose name is the hash of the BLOB. The BLOB files could be stored in a BLOB directory, or a directory (perhaps a digital search tree organized by successive bytes of the BLOB hash). Each BLOB file could contain the list of spans that represents the BLOB. To avoid incurring the file system's per-file space overhead, multiple BLOB's could be stored within a single "BLOB" file.

XXII. Embodiments Using A Virtual Block Device

Figure 32:
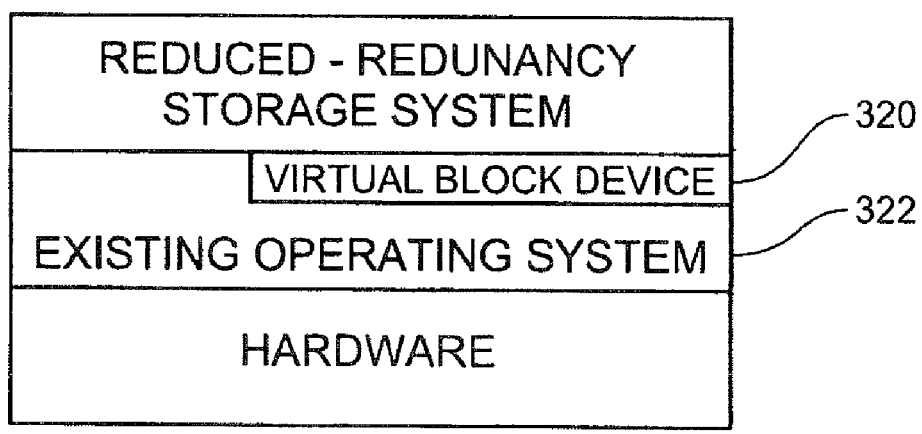
FIG. 32 depicts an embodiment in which a reduced redundancy storage system is implemented using ("on top of") a virtual block device provided by an existing operating system.

Embodiments of the present invention could be implemented using a virtual block device 320 provided by an existing operating system 322 (FIG. 32). The clusters could be stored within the virtual block device contiguously and located using a cluster index held in memory.

XXIII. Embodiments That Do Not Store The Data

Figure 35:
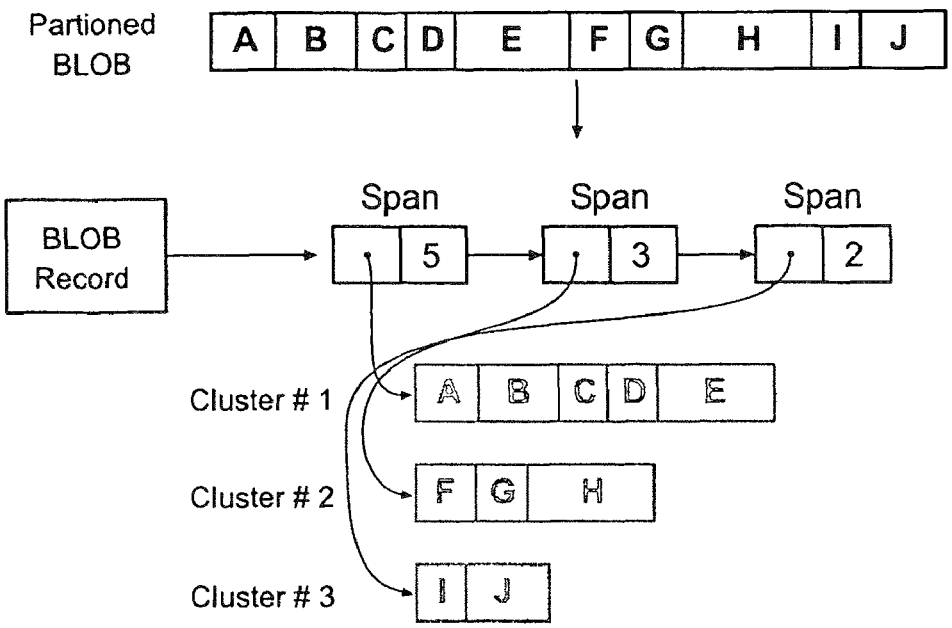
FIG. 35 depicts an embodiment in which the structures and metadata required to store a BLOB have been created, but the data itself is not stored.
Figure 36:
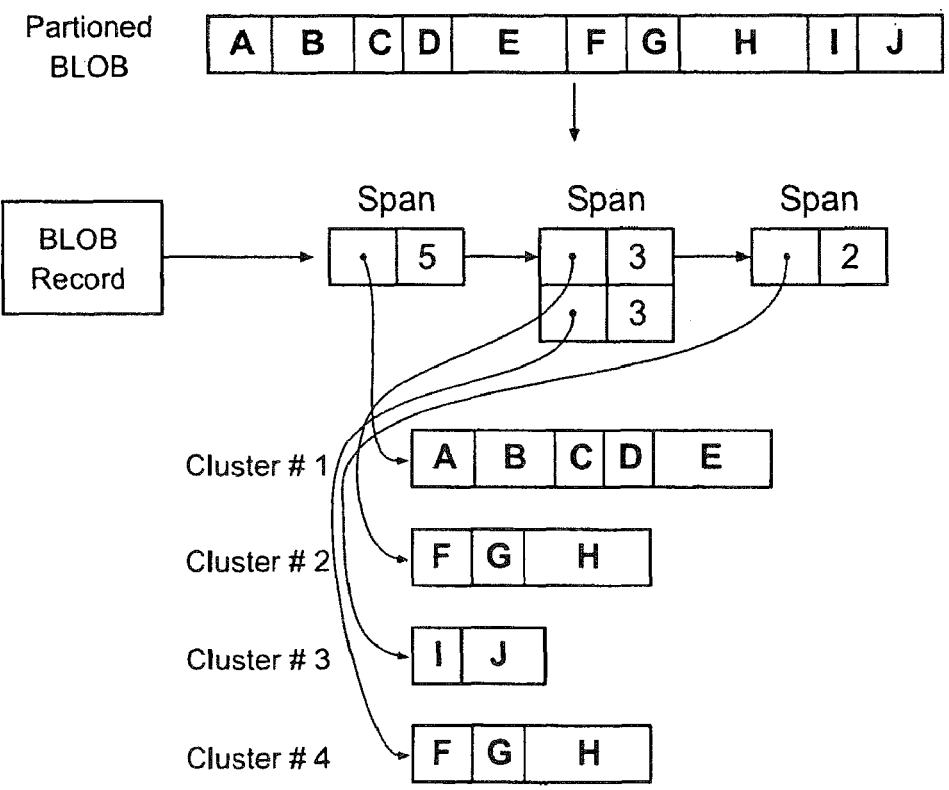
FIG. 36 shows a span (second in the list of spans) that has been augmented with an alternative span that points to the same data as the original span (subblocks FGH), but located in a different part of the store (in this case a different cluster).
Figure 37:
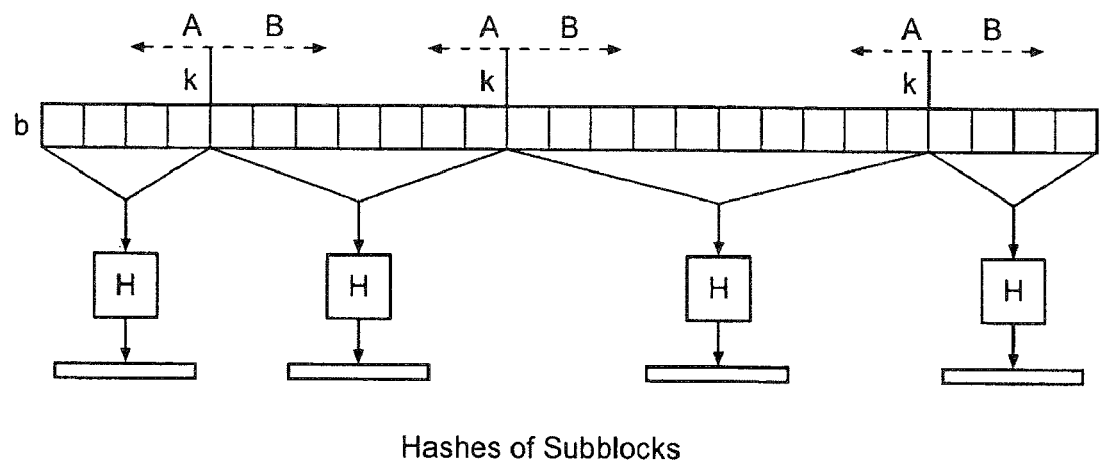
FIG. 37 shows the partitioning of a block b into subblocks using a constraint F, and the calculation of the hashes of the subblocks using hash function H.

An embodiment could be created that is identical to any of the embodiments previously discussed, but which does not actually store any BLOB data (FIG. 35). In such embodiments, all the storage structures and metadata could be constructed, but the BLOB/subblock content not stored. An embodiment such as this could be useful in applications where a BLOB BLOB2 must be analysed in relation to a previously encountered BLOB1, but in which neither BLOB must actually be stored.

For example, in a security environment, it may be advantageous not to store the BLOB content itself, but use BLOB metadata to analyse BLOBs in relation to previously encountered BLOBs. By using the storage structures and metadata representative of existing BLOBs, a store can analyse a document with respect to a body of previously encountered BLOBs without requiring access to the previously encountered BLOBs. This could be applied in, for example, a secure gateway.

XXIV. A Note on Scope

It will be appreciated by those skilled in the art that the invention is not restricted in its use to the particular application described. Neither is the present invention restricted in its preferred embodiment with regard to the particular elements and/or features described or depicted herein. It will be appreciated that various modifications can be made without departing from the principles of the invention. Therefore, the invention should be understood to include all such modifications within its scope.

What is claimed is:

1. A computer, comprising:
    a processor; and
    a memory, the memory having computer executable instructions that when executed by the computer cause the computer to perform a method, the method comprising:
    identifying a first run of sub-blocks in a Binary Large Object (BLOB) that matches a second run of sub-blocks in a cluster of stored sub-blocks, where the cluster of stored sub-blocks is associated with a data de-duplication environment, and where the cluster of sub-blocks comprises cluster metadata, sub-block metadata, and sub-blocks, and where the sub-blocks are stored contiguously without intervening metadata; and
    manipulating a BLOB representation by storing information about the second run of sub-blocks in the BLOB representation in a manner that facilitates not storing the first run of sub-blocks in the data de-duplication environment and that facilitates accessing the second run of sub-blocks in a single sequential operation; and
    identifying a suffix of a sub-block that immediately precedes the first run of sub-blocks that matches a suffix of a sub-block that immediately precedes the second run of sub-blocks, and
    updating the BLOB representation by storing information about the suffix of the sub-block that immediately precedes the second run of sub-blocks in the BLOB representation in a manner that facilitates not storing the suffix of the sub-block that immediately precedes the first run of sub-blocks and that facilitates accessing the second run of sub-blocks and the suffix of the sub-block that immediately precedes the second run of sub-blocks in a single sequential operation; and
    where identifying a first run of sub-blocks in a BLOB that matches a second run of sub-blocks in a cluster of stored sub-blocks operates at the sub-block level by matching hashes of sub-blocks, and
    where identifying a prefix of a sub-block that immediately follows the first run of sub-blocks that matches a prefix of a sub-block that immediately follows the second run of sub-blocks operates below the sub-block level without matching sub-block hashes.

2. A method for manipulating a Binary Large Object (BLOB) representation in a sub-block based de-duplication environment, the method comprising:
    identifying a first run of sub-blocks in a BLOB that matches a second run of sub-blocks in a cluster of stored sub-blocks, where the cluster of stored sub-blocks is associated with a data de-duplication environment, and where the cluster of sub-blocks comprises cluster metadata, sub-block metadata, and sub-blocks, and where the sub-blocks are stored contiguously without intervening metadata; and
    manipulating a BLOB representation by storing information about the second run of sub-blocks in the BLOB representation in a manner that facilitates not storing the first run of sub-blocks in the data de-duplication environment and that facilitates accessing the second run of sub-blocks in a single sequential operation; and
    identifying a suffix of a sub-block that immediately precedes the first run of sub-blocks that matches a suffix of a sub-block that immediately precedes the second run of sub-blocks, and
    updating the BLOB representation by storing information about the suffix of the sub-block that immediately precedes the second run of sub-blocks in the BLOB representation in a manner that facilitates not storing the suffix of the sub-block that immediately precedes the first run of sub-blocks and that facilitates accessing the second run of sub-blocks and the suffix of the sub-block that immediately precedes the second run of sub-blocks in a single sequential operation; and
    where identifying a first run of sub-blocks in a BLOB that matches a second run of sub-blocks in a cluster of stored sub-blocks operates at the sub-block level by matching hashes of sub-blocks, and
    where identifying a prefix of a sub-block that immediately follows the first run of sub-blocks that matches a prefix of a sub-block that immediately follows the second run of sub-blocks operates below the sub-block level without matching sub-block hashes.

* * * * *